United States Patent
Ishitani et al.

(10) Patent No.: US 12,290,002 B2
(45) Date of Patent: Apr. 29, 2025

(54) MAGNETIZATION ROTATIONAL ELEMENT, MAGNETORESISTANCE EFFECT ELEMENT, SEMICONDUCTOR ELEMENT, MAGNETIC RECORDING ARRAY, AND METHOD FOR MANUFACTURING MAGNETORESISTANCE EFFECT ELEMENT

(71) Applicant: TDK CORPORATION, Tokyo (JP)

(72) Inventors: Yugo Ishitani, Tokyo (JP); Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/232,941

(22) Filed: Aug. 11, 2023

(65) Prior Publication Data
US 2023/0389442 A1 Nov. 30, 2023

Related U.S. Application Data

(62) Division of application No. 17/104,931, filed on Nov. 25, 2020, now Pat. No. 11,770,978.

(30) Foreign Application Priority Data

Nov. 26, 2019 (JP) .................. 2019-212835
Oct. 14, 2020 (JP) .................. 2020-173445

(51) Int. Cl.
*H10N 50/10* (2023.01)
*G11C 11/16* (2006.01)
(Continued)

(52) U.S. Cl.
CPC .......... *H10N 50/10* (2023.02); *G11C 11/161* (2013.01); *G11C 11/1673* (2013.01);
(Continued)

(58) Field of Classification Search
CPC ........ H10N 50/10; H10N 50/80; H10N 50/01; H10N 50/85; H10B 61/22; G11C 11/161; G11C 11/1673; G11C 11/1675
(Continued)

(56) References Cited

U.S. PATENT DOCUMENTS 8,350,347 B2 1/2013 Gaudin et al.
10,593,388 B2 3/2020 Shiokawa et al.
(Continued)

FOREIGN PATENT DOCUMENTS

CN 108886061 A 11/2018
JP 2017-216286 A 12/2017
(Continued)

OTHER PUBLICATIONS

Kato et al.; "Observation of the Spin Hall Effect in Semiconductors"; Science; Dec. 2004; vol. 306; pp. 1910-1913.
(Continued)

*Primary Examiner* — Jami Valentine Miller
(74) *Attorney, Agent, or Firm* — Oliff PLC

(57) ABSTRACT

A magnetization rotational element includes a spin-orbit torque wiring, and a first ferromagnetic layer which is located in a first direction with respect to the spin-orbit torque wiring and in which spins are injected from the spin-orbit torque wiring. The spin-orbit torque wiring has a plurality of spin generation layers and insertion layers located between the plurality of spin generation layers in the first direction. The insertion layers have a lower electrical resistivity than the spin generation layers.

20 Claims, 18 Drawing Sheets

(51) Int. Cl.
  *H10B 61/00* (2023.01)
  *H10N 50/01* (2023.01)
  *H10N 50/80* (2023.01)
  *H10N 50/85* (2023.01)

(52) U.S. Cl.
  CPC .......... *G11C 11/1675* (2013.01); *H10B 61/22* (2023.02); *H10N 50/01* (2023.02); *H10N 50/80* (2023.02); *H10N 50/85* (2023.02)

(58) Field of Classification Search
  USPC .......................................................... 257/421
  See application file for complete search history.

(56) References Cited

U.S. PATENT DOCUMENTS

| | | | |
|---|---|---|---|
| 10,593,868 | B2 | 3/2020 | Shiokawa et al. |
| 2014/0252439 | A1 | 9/2014 | Guo |
| 2015/0348606 | A1 | 12/2015 | Buhrman et al. |
| 2016/0276006 | A1* | 9/2016 | Ralph ..................... H10N 50/10 |
| 2017/0076769 | A1 | 3/2017 | Shirotori et al. |
| 2017/0077394 | A1 | 3/2017 | Saida |
| 2017/0169872 | A1 | 6/2017 | Yoda et al. |
| 2017/0222135 | A1 | 8/2017 | Fukami et al. |
| 2018/0114558 | A1 | 4/2018 | Yoda et al. |
| 2018/0254773 | A1* | 9/2018 | Yoshinari ................. H03K 3/84 |
| 2018/0301199 | A1* | 10/2018 | Sasaki ..................... G11C 27/00 |
| 2018/0308535 | A1* | 10/2018 | Shiokawa ........... G11C 11/1659 |
| 2019/0057732 | A1 | 2/2019 | Shiokawa et al. |
| 2019/0066749 | A1 | 2/2019 | Yoda et al. |
| 2019/0074043 | A1* | 3/2019 | Sasaki ..................... H10N 50/85 |
| 2019/0088711 | A1* | 3/2019 | Shiokawa .............. H10N 52/80 |
| 2019/0267542 | A1 | 8/2019 | Komura et al. |
| 2019/0348329 | A1 | 11/2019 | Shiokawa et al. |
| 2020/0136017 | A1 | 4/2020 | Ashida et al. |
| 2020/0312392 | A1* | 10/2020 | Tsumita ................. H10N 52/00 |
| 2020/0357982 | A1* | 11/2020 | Kula .................... G11C 11/1675 |
| 2021/0167278 | A1* | 6/2021 | Ishitani ............... G11C 11/1675 |

FOREIGN PATENT DOCUMENTS

| | | |
|---|---|---|
| WO | 2016/021468 A1 | 2/2016 |
| WO | 2019/167575 A1 | 9/2019 |

OTHER PUBLICATIONS

Miron et al.; "Perpendicular switching of a single ferromagnetic layer induced by in-plane current injection"; Letter; Aug. 2011; vol. 476; pp. 189-194.

Liu et al.; "Spin torque switching with the giant spin Hall effect of tantalum"; Cornell University and Kavli Institute at Cornell; Mar. 2012; pp. 1-19; pp. 1-12.

Liu et al.; "Current-Induced Switching of Perpendicularly Magnetized Magnetic Layers Using Spin Torque from the Spin Hall Effect"; Physical Review Letters; Aug. 2012; vol. 109; pp. 096602-1-096602-5.

Lee at al.; "Threshold current for switching of a perpendicular magnetic layer induced by spin Hall effect"; Applied Physics Letters; Mar. 2013; vol. 102; pp. 1-17.

Lee et al.; "Thermally activated switching of perpendicular magnet by spin-orbit spin torque"; Applied Physics Letters; 2014; vol. 104; pp. 072413-1-072413-5.

Fukami et al.; "Magnetization switching by spin-orbit torque in an antiferromagnet-ferromagnet bilayer system"; Nature Materials; May 2016; vol. 15; pp. 535-542.

Fukami et al.; "A spin-orbit torque switching scheme with collinear magnetic easy axis and current configuration"; Nature Nanotechnology; Mar. 2016; vol. 11; pp. 1-6.

Takahashi et al.; "Spin injection and detection in magnetic nanostructures"; Physical Review B; 2003; vol. 67; pp. 052409-1-052409-4.

Feb. 2, 2023 Office Action issued in U.S. Appl. No. 17/104,931.

Apr. 27, 2023 Office Action issued in Chinese Patent Application No. 202011319561.X.

* cited by examiner

MAGNETIZATION ROTATIONAL ELEMENT, MAGNETORESISTANCE EFFECT ELEMENT, SEMICONDUCTOR ELEMENT, MAGNETIC RECORDING ARRAY, AND METHOD FOR MANUFACTURING MAGNETORESISTANCE EFFECT ELEMENT

This application is a divisional application of application Ser. No. 17/104,931, filed Nov. 25, 2020, which claims priority to Japanese patent application no. 2019-212835, filed Nov. 26, 2019, and Japanese patent application no. 2020-173445, filed Oct. 14, 2020, the entire content of each of which is hereby incorporated by reference.

BACKGROUND OF THE INVENTION

Field of the Invention

The present invention relates to a magnetization rotational element, a magnetoresistance effect element, a semiconductor element, a magnetic recording array, and a method for manufacturing a magnetoresistance effect element.

Description of Related Art

Giant magnetoresistance (GMR) elements constituted of a multilayer film having ferromagnetic layers and a nonmagnetic layer, and tunnel magnetoresistance (TMR) elements using an insulating layer (a tunnel barrier layer or a barrier layer) as a nonmagnetic layer are known as magnetoresistance effect elements. A magnetoresistance effect element can be applied to magnetic sensors, high-frequency components, magnetic heads, and magnetic random access memories (MRAMs).

An MRAM is a storage element in which a magnetoresistance effect element is integrated. An MRAM reads and writes data utilizing characteristics in which a resistance of a magnetoresistance effect element varies when directions of magnetization of two ferromagnetic layers having a nonmagnetic layer interposed therebetween vary in the magnetoresistance effect element. For example, directions of magnetization of ferromagnetic layers are controlled utilizing a magnetic field generated due to a current. In addition, for example, directions of magnetization of ferromagnetic layers are controlled utilizing a spin transfer torque (STT) generated when a current flows in a lamination direction of a magnetoresistance effect element.

When directions of magnetization of ferromagnetic layers are rewritten utilizing an STT, a current is caused to flow in the lamination direction of a magnetoresistance effect element. A writing current may cause deterioration in characteristics of a magnetoresistance effect element.

Recently, methods in which a current may not flow in the lamination direction of a magnetoresistance effect element at the time of writing have drawn attention. A writing method utilizing a spin-orbit torque (SOT) is one of these methods (for example, Patent Document 1). An SOT is induced by means of a spin current generated due to a spin-orbit interaction or a Rashba effect in an interface between materials of different kinds. A current for inducing an SOT in a magnetoresistance effect element flows in a direction intersecting the lamination direction of the magnetoresistance effect element. That is, there is no need to cause a current to flow in the lamination direction of the magnetoresistance effect element, and thus a long lifespan of the magnetoresistance effect element is expected.

PATENT DOCUMENT

[Patent Document 1] Japanese Unexamined Patent Application, First Publication No. 2017-216286

SUMMARY OF THE INVENTION

In order to obtain a significant SOT, there is a need to use a material manifesting a significant spin-orbit interaction for a wiring. For example, it is said that heavy metals, such as Ta and W, are materials having a large spin Hall angle and manifesting a significant spin-orbit interaction. However, these heavy metals have a significant electrical resistance. If an electrical resistance in a writing wiring for writing data is significant, a writing voltage increases.

The present invention has been made in consideration of the foregoing circumstances, and an object thereof is to provide a magnetization rotational element, a magnetoresistance effect element, a semiconductor element, a magnetic recording array, and a method for manufacturing a magnetoresistance effect element capable of reducing a voltage for writing data.

In order to resolve the foregoing problem, the present invention provides the following means.

(1) According to a first aspect, there is provided a magnetization rotational element including: a spin-orbit torque wiring; and a first ferromagnetic layer which is located in a first direction with respect to the spin-orbit torque wiring and configured for spins to be injected from the spin-orbit torque wiring, wherein the spin-orbit torque wiring has a plurality of spin generation layers and at least one insertion layer located between the plurality of spin generation layers in the first direction, and wherein the insertion layer has a lower electrical resistivity than the spin generation layers.

(2) In the magnetization rotational element according to the foregoing aspect, the insertion layers may include an element selected from a group consisting of Mg, Al, Si, Ti, Cr, Fe, Co, Cu, Ga, Ge, and Ag.

(3) In the magnetization rotational element according to the foregoing aspect, the spin generation layers may include an element selected from the group consisting of Mo, Ru, Rh, Pd, Ta, W, Ir, Pt, Au, and Bi.

(4) In the magnetization rotational element according to the foregoing aspect, a thickness of the insertion layer may be equal to or smaller than a spin diffusion length in a material constituting the insertion layer.

(5) In the magnetization rotational element according to the foregoing aspect, the at least one insertion layer may include a plurality of insertion layers, and wherein the number of the insertion layers is six or smaller.

(6) In the magnetization rotational element according to the foregoing aspect, the spin-orbit torque wiring may include an overlapping region that overlaps the first ferromagnetic region and non-overlapping region that is free of overlapping with the first ferromagnetic region in a plan view in the first direction, and wherein the at least one insertion layer may extend over the non-overlapping region with the overlapping region interposed therebetween.

(7) In the magnetization rotational element according to the foregoing aspect, the thickness of the at least one insertion layer may be smaller than a thickness of each of the spin generation layers.

(8) In the magnetization rotational element according to the foregoing aspect, the thickness of the at least one insertion layer may be equal to or smaller than five times a coupling radius of an element constituting the insertion layers.

(9) In the magnetization rotational element according to the foregoing aspect, the thickness of the at least one insertion layer may be 10 Å or smaller.

(10) In the magnetization rotational element according to the foregoing aspect, the thickness of each of the spin generation layers may be within a range of 8 Å to 20 Å.

(11) In the magnetization rotational element according to the foregoing aspect, the at least one insertion layer may include an element constituting the spin generation layers.

(12) In the magnetization rotational element according to the foregoing aspect, a cross-sectional area of a spin generation layer farther from the first ferromagnetic layer with the at least one insertion layer interposed therebetween may be larger than a cross-sectional area of a spin generation layer closer to the first ferromagnetic layer with the at least one insertion layer interposed therebetween in a cross section cut in the first direction and a longitudinal direction of the spin-orbit torque wiring.

(13) In the magnetization rotational element according to the foregoing aspect, a thickness of the spin-orbit torque wiring may be 20 nm or smaller.

(14) In the magnetization rotational element according to the foregoing aspect, a film thickness of a first spin generation layer among the plurality of spin generation layers may be larger than film thicknesses of other spin generation layers, the first spin generation layer being a spin generation layer closest to the first ferromagnetic layer.

(15) According to a second aspect, there is provided a magnetization rotational element including: a wiring; and a first ferromagnetic layer which is located in a first direction with respect to the wiring, wherein the wiring includes: first layers including any element selected from the group consisting of Mo, Ru, Rh, Pd, Ta, W, Ir, Pt, Au, and Bi, and a second layer including any element selected from the group consisting of Mg, Al, Si, Ti, Cr, Fe, Co, Cu, Ga, Ge, and Ag, and wherein the second layer is interposed between the first layers in the first direction.

(16) According to a third aspect, there is provided a magnetoresistance effect element including: the magnetization rotational element according to any one of the foregoing aspects; a second ferromagnetic layer which is located in the first direction with respect to the first ferromagnetic layer of the magnetization rotational element; and a nonmagnetic layer which is interposed between the first ferromagnetic layer and the second ferromagnetic layer.

(17) According to a fourth aspect, there is provided a semiconductor element including: the magnetoresistance effect element according to the foregoing aspect; and a switching element which is electrically connected to the magnetoresistance effect element.

(18) In the semiconductor element according to the foregoing aspect, the switching element may be a field effect transistor, and wherein a distance between a source and a drain of the field effect transistor may be 30 nm or shorter.

(19) According to a fifth aspect, there is provided a magnetic recording array including a plurality of magnetoresistance effect elements according to the foregoing aspect.

(20) According to a sixth aspect, there is provided a method for manufacturing a magnetoresistance effect element including: a film formation step of forming a laminate in which a second ferromagnetic layer, a nonmagnetic layer, a first ferromagnetic layer, and a first spin generation layer are laminated in order; a processing step of forming a columnar body by etching the laminate; and a wiring forming step of forming a spin-orbit torque wiring by performing film formation of an insertion layer and a spin generation layer in order on a first surface of the columnar body, wherein the insertion layer has a lower electrical resistivity than the first spin generation layer and the spin generation layer.

(21) In the method for manufacturing a magnetoresistance effect element according to the foregoing aspect, the processing step may be performed through a hard mask layer laminated on a portion of a first surface of the laminate, and wherein the hard mask layer may be removed before the wiring forming step, and the first spin generation layer may be exposed to the first surface of the columnar body.

(22) In the method for manufacturing a magnetoresistance effect element according to the foregoing aspect, the processing step may be performed through a hard mask layer laminated on a portion of a first surface of the laminate, and wherein the hard mask layer may be constituted of a same material as the first spin generation layer.

(23) In the method for manufacturing a magnetoresistance effect element according to the foregoing aspect, the first spin generation layer may have a larger thickness than the spin generation layer.

The magnetization rotational element, the magnetoresistance effect element, the semiconductor element, the magnetic recording array, and the method for manufacturing a magnetoresistance effect element according to the present embodiment can reduce a voltage for writing data.

DETAILED DESCRIPTION OF THE INVENTION

Hereinafter, the present embodiment will be described in detail suitably with reference to the drawings. In drawings used in the following description, in order to make characteristics easy to understand, characteristic portions may be illustrated in an enlarged manner for the sake of convenience, and dimensional ratios or the like of each constituent element may differ from actual values thereof. Exemplary materials, dimensions, and the like illustrated in the following description are merely examples. The present invention is not limited thereto and can be suitably changed and performed within a range in which the effects of the present invention are exhibited.

First, directions will be defined. One direction on a surface of a substrate Sub (refer to FIG. 2) which will be described below will be referred to as an x direction, and a direction orthogonal to the x direction will be referred to as a y direction. The x direction is a direction in which a spin-orbit torque wiring 20 (which will be described below) extends and is a length direction of the spin-orbit torque wiring 20. A z direction is a direction orthogonal to the x direction and the y direction. The z direction is an example of a first direction. Hereinafter, a positive z direction may be expressed as "upward", and a negative z direction may be expressed as "downward". Upward and downward directions do not necessarily coincide with a direction in which gravity is applied.

For example, in this specification, the expression "extending in the x direction" denotes that a dimension in the x direction is larger than a smallest dimension of each of the dimensions in the x direction, the y direction, and the z direction. The same applies to the case of extending in other directions. In addition, in this specification, the term "connect" is not limited to a case of being physically connected. For example, the term "connect" is not limited to a case in which two layers physically come into contact with each other and also includes a case in which two layers are connected to each other with another layer interposed therebetween. In addition, the term "connect" also includes a case in which two members are electrically connected to each other.

First Embodiment

Figure 1:
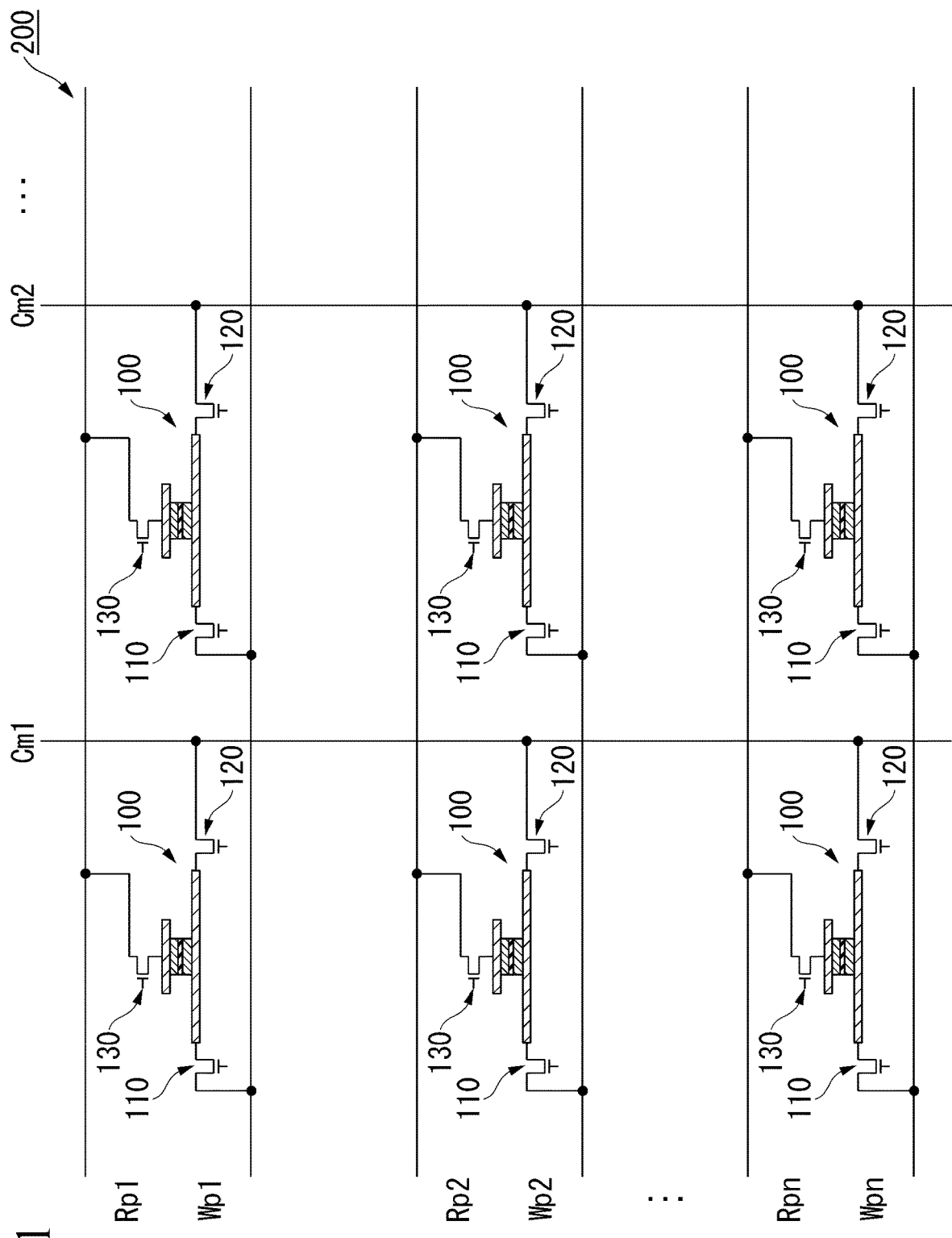
FIG. 1 is a schematic view of a magnetic recording array according to a first embodiment.

FIG. 1 is a view of a constitution of a magnetic recording array 200 according to a first embodiment. The magnetic recording array 200 includes a plurality of magnetoresistance effect elements 100, a plurality of writing wirings Wp1 to Wpn, a plurality of common wirings Cm1 to Cmn, a plurality of reading wirings Rp1 to Rpn, a plurality of first switching elements 110, a plurality of second switching elements 120, and a plurality of third switching elements 130. For example, the magnetic recording array 200 can be utilized for a magnetic memory and the like.

The writing wirings Wp1 to Wpn electrically connect a power source and one or more magnetoresistance effect elements 100 to each other. The common wirings Cm1 to Cmn are wirings used at times of both writing and reading data. The common wirings Cm1 to Cmn electrically connect a reference electric potential and one or more magnetoresistance effect elements 100 to each other. For example, the reference electric potential is the ground potential. The common wirings Cm1 to Cmn may be provided in each of the plurality of magnetoresistance effect elements 100 or may be provided over the plurality of magnetoresistance effect elements 100. The reading wirings Rp1 to Rpn electrically connect the power source and one or more magnetoresistance effect elements 100 to each other. The power source is connected to the magnetic recording array 200 when in use.

The first switching elements 110, the second switching elements 120, and the third switching elements 130 illustrated in FIG. 1 are respectively connected to the plurality of magnetoresistance effect elements 100. The first switching elements 110 are connected to a portion between each of the magnetoresistance effect elements 100 and the writing wirings Wp1 to Wpn. The second switching elements 120 are connected to a portion between each of the magnetoresistance effect elements 100 and the common wirings Cm1 to Cmn. The third switching elements 130 are connected to a portion between each of the magnetoresistance effect elements 100 and the reading wirings Rp1 to Rpn.

When the first switching elements 110 and the second switching elements 120 are turned on, a writing current flows between the writing wirings Wp1 to Wpn and the common wirings Cm1 to Cmn connected to predetermined magnetoresistance effect elements 100. When the second switching elements 120 and the third switching elements 130 are turned on, a reading current flows between the common wirings Cm1 to Cmn and the reading wirings Rp1 to Rpn connected to predetermined magnetoresistance effect elements 100.

The first switching elements 110, the second switching elements 120, and the third switching elements 130 are elements for controlling a flow of a current. For example, the first switching elements 110, the second switching elements 120, and the third switching elements 130 are elements such as transistors or ovonic threshold switches (OTSs) utilizing phase change in a crystal layer, elements such as metal insulator transfer (MIT) switches utilizing variation in a band structure, elements such as Zener diodes and avalanche diodes utilizing a breakdown voltage, or elements of which conductivity varies in accordance with variation in atom positions.

Any of the first switching elements 110, the second switching elements 120, and the third switching elements 130 may be shared by the magnetoresistance effect element 100 connected to the same wiring.

For example, when the first switching elements 110 are shared, one first switching element 110 is provided on an upstream side of the writing wirings Wp1 to Wpn. For example, when the second switching elements 120 are shared, one second switching element 120 is provided on an upstream side of the common wirings Cm1 to Cmn. For example, when the third switching elements 130 are shared, one third switching element 130 is provided on an upstream side of the reading wirings Rp1 to Rpn.

Figure 2:
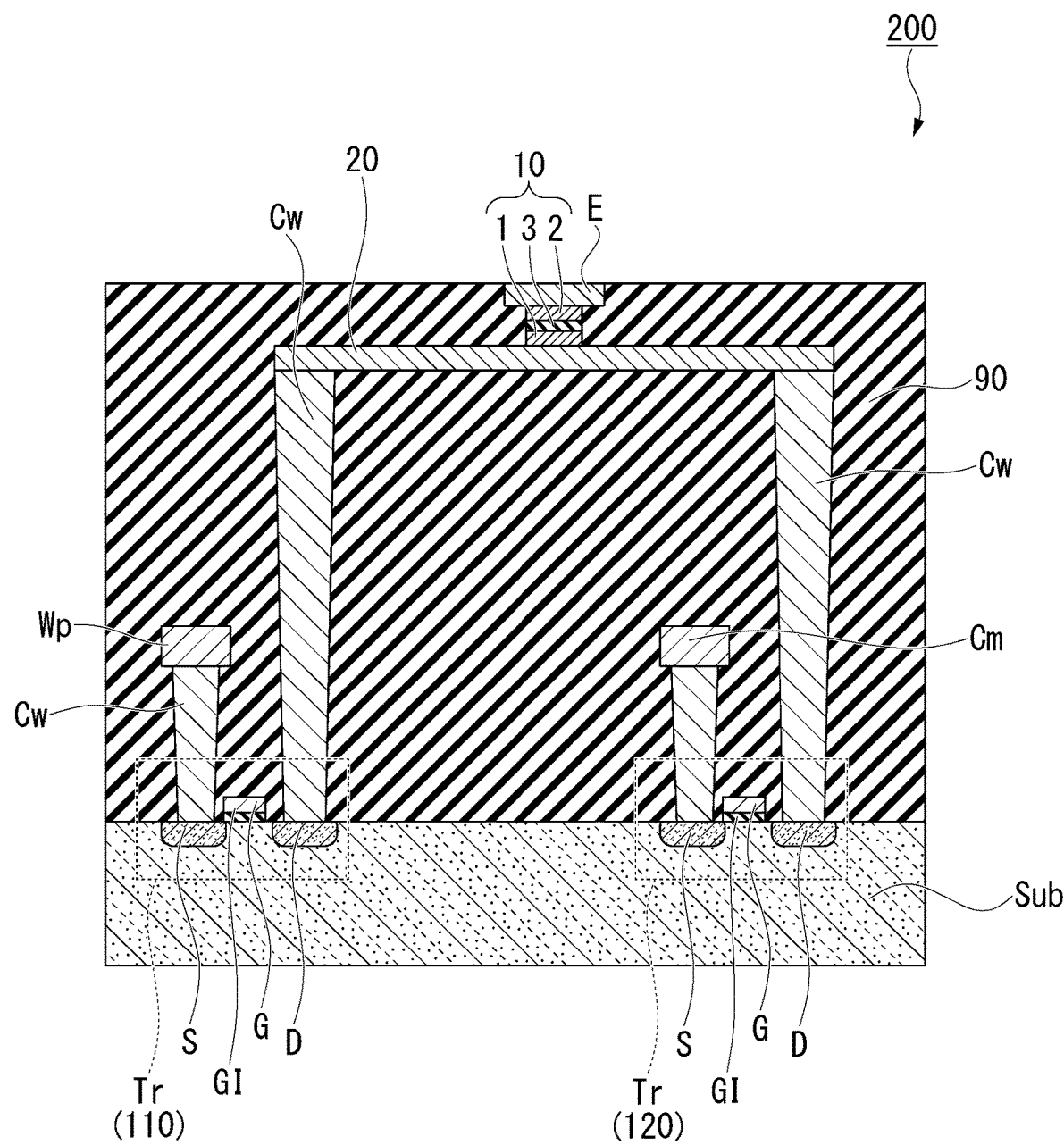
FIG. 2 is a cross-sectional view of the magnetic recording array according to the first embodiment.

FIG. 2 is a cross-sectional view of a semiconductor element constituting the magnetic recording array 200 according to the first embodiment. FIG. 2 is a cross section of the magnetoresistance effect element 100 cut along an xz plane passing through a center of a width of the spin-orbit torque wiring 20 (which will be described below) in the y direction. An element in which the first switching element 110 or the second switching element 120 is connected to the magnetoresistance effect element 100 may be referred to as a semiconductor element.

The first switching element 110 and the second switching element 120 illustrated in FIG. 2 are transistors Tr. The third switching element 130 is electrically connected to an electrode E and positioned in the y direction, for example. For example, the transistors Tr are field effect transistors and have a gate electrode G, a gate insulating film GI, and a source S and a drain D formed on the substrate Sub. For example, the substrate Sub is a semiconductor substrate.

For example, a distance between the source S and the drain D of the transistor Tr is 30 nm or shorter, preferably 20 nm or shorter, and more preferably 10 nm or shorter. When the distance between the source S and the drain D is shortened, an area occupied by one transistor Tr is reduced, and thus an exclusive area for the transistor Tr directly related to an accumulation rate of the magnetic recording array 200 is reduced. On the other hand, when the distance between the source S and the drain D is shortened, a withstand voltage of the transistor Tr is reduced. When the withstand voltage of the transistor Tr is reduced, a writing voltage of the magnetoresistance effect element 100 decreases, and thus there is a need to operate the magnetoresistance effect element 100 with a low writing voltage.

For example, in the case in which the distance between the source S and the drain D is approximately 10 nm, it is preferable that the transistor Tr be operated at 0.5 V or lower.

Each of the transistors Tr and the magnetoresistance effect element 100 are electrically connected to each other via a conductive part Cw. For example, the conductive part Cw may be referred to as a connection wiring or a via.

The conductive part Cw includes a material having conductivity. The conductive part Cw extends in the z direction.

The magnetoresistance effect element 100 and the transistor Tr are electrically separated from each other except for the conductive part Cw due to an insulating layer 90. The insulating layer 90 is an insulating layer for insulating wirings, such as multilayer wirings, or elements from each other. For example, the insulating layer 90 is formed of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

The electrode E is constituted of a material having conductivity. For example, the electrode E is constituted of a transparent electrode material.

For example, the electrode E may be formed of indium zinc oxide (IZO), indium-tin oxide (ITO), tin oxide ($SnO_2$), an antimony oxide-tin oxide-based material (ATO), zinc oxide (ZnO), fluorine-doped tin oxide (FTO), indium oxide ($In_2O_3$), or the like. If the electrode E is transparent, orientation directions of magnetizations M1 and M2 are easily read from outside.

Figure 3:
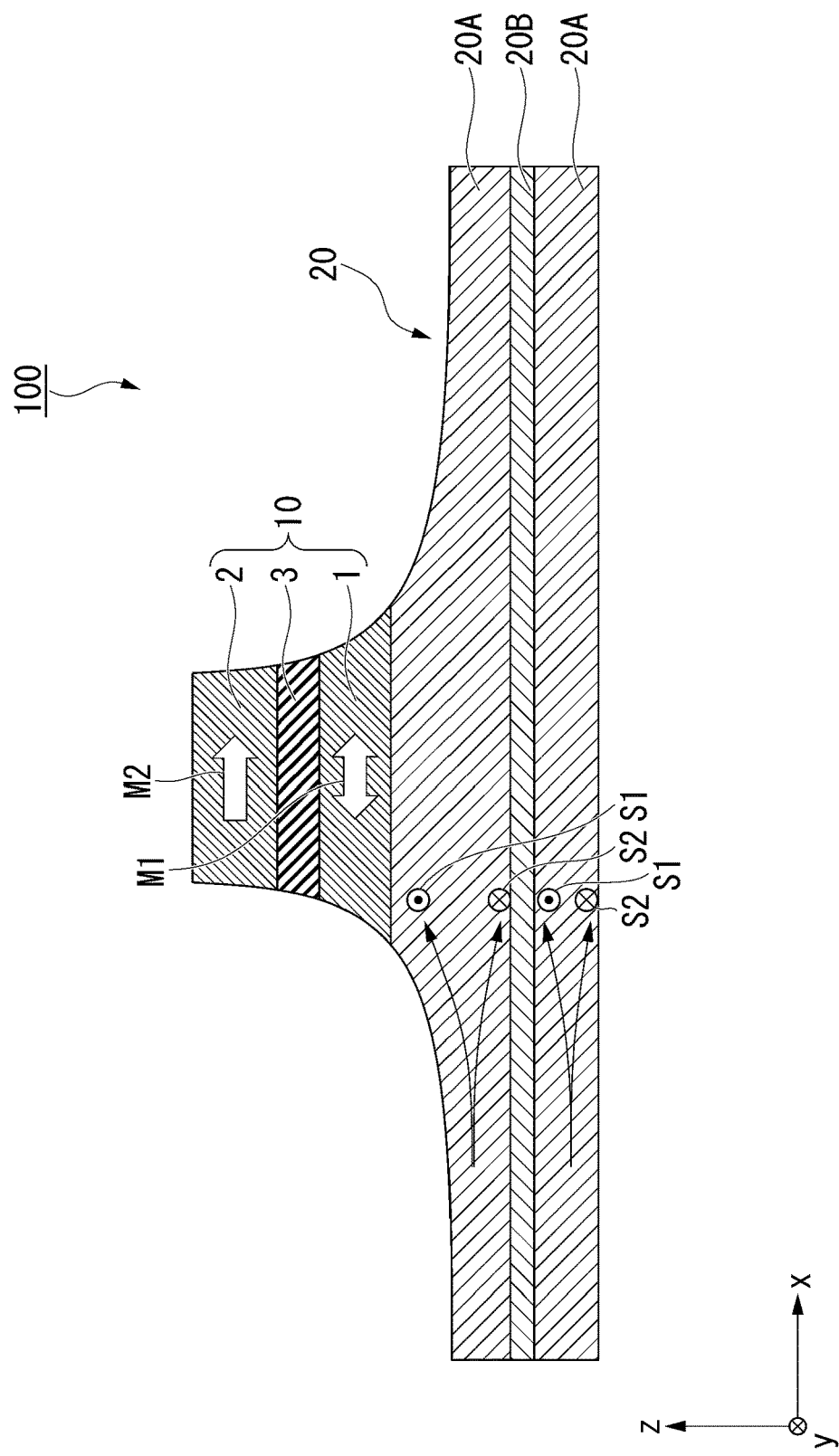
FIG. 3 is a cross-sectional view of a magnetoresistance effect element according to the first embodiment.
Figure 4:
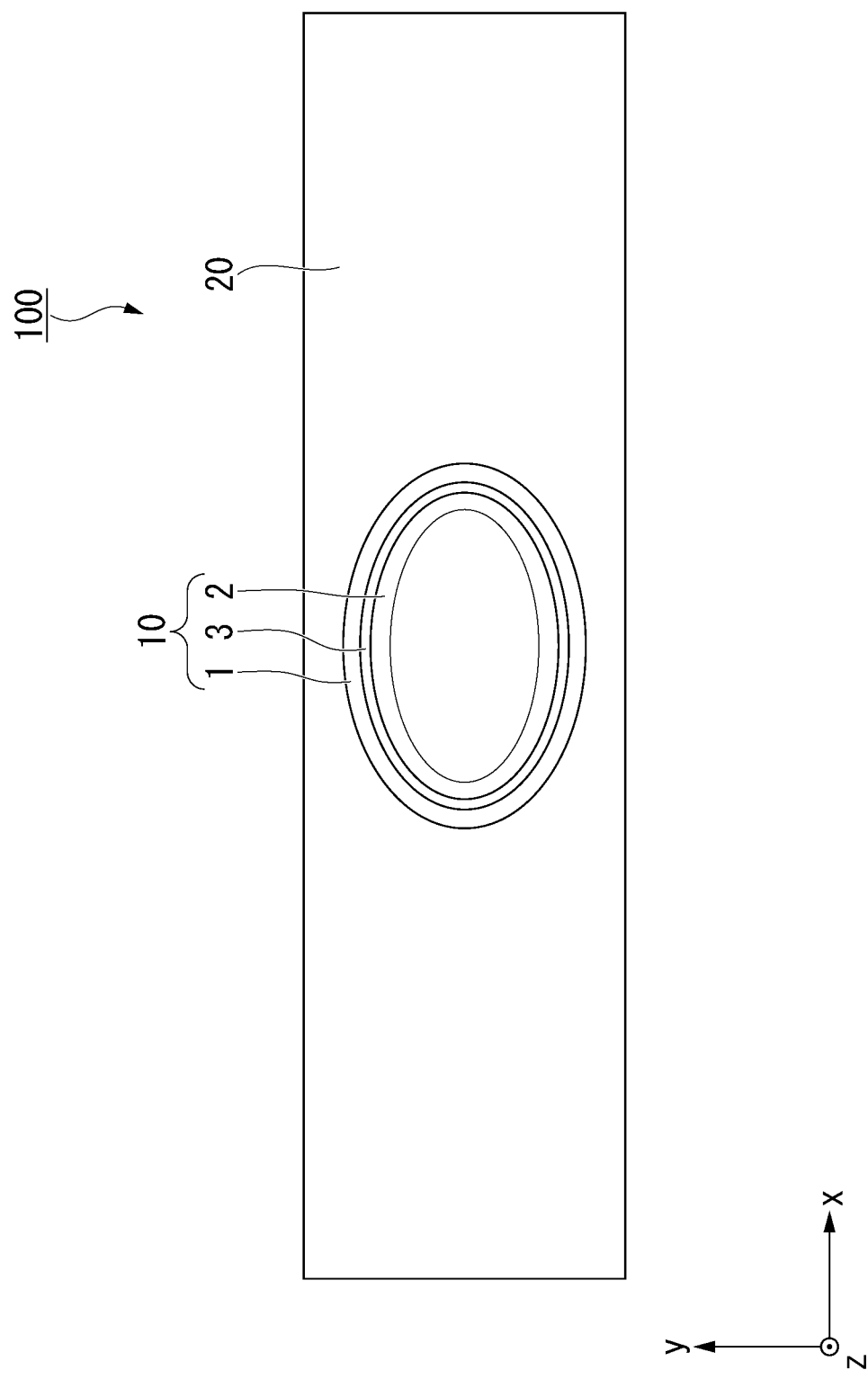
FIG. 4 is a plan view of the magnetoresistance effect element according to the first embodiment.

FIG. 3 is a cross-sectional view of the magnetoresistance effect element 100 according to the first embodiment. FIG. 4 is a plan view of the magnetoresistance effect element 100 according to the first embodiment. FIG. 3 is a cross section of the magnetoresistance effect element 100 cut along the xz plane passing through the center of the width of the spin-orbit torque wiring 20 in the y direction.

FIG. 4 is a plan view of the magnetoresistance effect element 100 in a plan view in the z direction.

The magnetoresistance effect element 100 has a resistance variation part 10 and the spin-orbit torque wiring 20.

The resistance variation part 10 is located in the z direction of the spin-orbit torque wiring 20. For example, the resistance variation part 10 is laminated on the spin-orbit torque wiring 20. A resistance value of the resistance variation part 10 in the z direction varies due to spins injected from the spin-orbit torque wiring 20. The magnetoresistance effect element 100 is a magnetic element utilizing a spin-orbit torque (SOT) and may be referred to as a spin-orbit torque magnetoresistance effect element, a spin injection magnetoresistance effect element, or a spin current magnetoresistance effect element.

The resistance variation part 10 is interposed between the spin-orbit torque wiring 20 and the electrode E in the z direction (refer to FIG. 2). The resistance variation part 10 is a columnar body. The shape of the resistance variation part 10 in a plan view in the z direction is an oval having a major axis in the x direction, for example, as illustrated in FIG. 4. The shape of the resistance variation part 10 in a plan view in the z direction is not limited to an oval and may be a circular shape or a rectangular shape, for example. For example, an outer circumferential length or a diameter of the resistance variation part 10 increases toward the spin-orbit torque wiring 20.

The resistance variation part 10 has a first ferromagnetic layer 1, a second ferromagnetic layer 2, and a nonmagnetic layer 3. The first ferromagnetic layer 1 is located in the z direction of the spin-orbit torque wiring 20. For example, the first ferromagnetic layer 1 comes into contact with the spin-orbit torque wiring 20 and is laminated on the spin-orbit torque wiring 20. Spins are injected into the first ferromagnetic layer 1 from the spin-orbit torque wiring 20. Regarding the magnetization M1 of the first ferromagnetic layer 1, the orientation direction varies when a spin-orbit torque (SOT) is received due to injected spins. The second ferromagnetic layer 2 is above the first ferromagnetic layer 1 in the z direction. The nonmagnetic layer 3 is interposed between the first ferromagnetic layer 1 and the second ferromagnetic layer 2 in the z direction.

The first ferromagnetic layer 1 and the second ferromagnetic layer 2 respectively have the magnetizations M1 and M2. The orientation direction of the magnetization M2 of the second ferromagnetic layer 2 is less likely to change than that of the magnetization M1 of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. In the resistance variation part 10, the resistance value varies in accordance with a difference between relative angles of the magnetizations M1 and M2 of the first ferromagnetic layer 1 and the second ferromagnetic layer 2 with the nonmagnetic layer 3 interposed therebetween. For example, the magnetizations M1 and M2 of the first ferromagnetic layer 1 and the second ferromagnetic layer 2 are oriented in the x direction.

The first ferromagnetic layer 1 and the second ferromagnetic layer 2 include a ferromagnetic body. For example, the ferromagnetic body is formed of a metal selected from the group consisting of Cr, Mn, Co, Fe, and Ni; an alloy including one or more of these metals; an alloy including at least one or more elements of these metals, B, C, and N; or the like. For example, the ferromagnetic body is formed of Co—Fe, Co—Fe—B, Ni—Fe, a Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X represents a transition metal element or a noble metal element of the Co-group, the Fe-group, the Ni-group, or the Cu-group on the periodic table, Y represents a transition metal of the Mn-group, the V-group, the Cr-group, or the Ti-group or an element represented by X, and Z represents a typical element from Groups III to V. For example, a Heusler alloy is formed of $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. A Heusler alloy has high spin polarization.

The resistance variation part 10 may have an antiferromagnetic layer with a spacer layer therebetween on a surface on a side opposite to the nonmagnetic layer 3 of the second ferromagnetic layer 2. The second ferromagnetic layer 2, the spacer layer, and the antiferromagnetic layer form a synthetic antiferromagnetic structure (SAF structure). The synthetic antiferromagnetic structure is constituted of two magnetic layers having a nonmagnetic layer interposed therebetween. Due to antiferromagnetic coupling of the second ferromagnetic layer 2 and the antiferromagnetic layer, a coercivity of the second ferromagnetic layer 2 increases compared to when the structure has no antiferromagnetic layer. For example, the antiferromagnetic layer is formed of IrMn, PtMn, or the like. For example, the spacer layer includes at least one selected from the group consisting of Ru, Ir, and Rh.

The resistance variation part 10 may have a layer other than the first ferromagnetic layer 1, the second ferromagnetic layer 2, and the nonmagnetic layer 3. For example, an underlayer may be provided between the spin-orbit torque wiring 20 and the resistance variation part 10. In addition, for example, a cap layer may be provided between the electrode E and the resistance variation part 10. The underlayer and the cap layer enhance crystallinity of each layer constituting the resistance variation part 10.

The spin-orbit torque wiring 20 is located in the z direction of the first ferromagnetic layer 1. The spin-orbit torque wiring 20 is an example of a wiring and is a writing wiring for writing data in the magnetoresistance effect element 100. For example, the spin-orbit torque wiring 20 has a longer length in the x direction than that in the y direction when viewed in the z direction and extends in the x direction. The first ferromagnetic layer 1 is interposed between at least a portion of the spin-orbit torque wiring 20 and the nonmagnetic layer 3 in the z direction.

In the spin-orbit torque wiring 20, in a plan view in the z direction, a region overlapping the first ferromagnetic layer 1 will be referred to as an overlapping region, and a region not overlapping the same will be referred to as a non-overlapping region. For example, a thickness of the overlapping region in the z direction is larger than a thickness of the non-overlapping region in the z direction. For example, the thickness of the non-overlapping region in the z direction increases toward the overlapping region. For example, an average thickness of the spin-orbit torque wiring 20 is 20 nm or shorter. The average thickness is an average value of thicknesses of the spin-orbit torque wiring in the z direction at ten points at different positions in the x direction. When the average thickness of the spin-orbit torque wiring 20 is sufficiently large, flatness on a surface of the spin-orbit torque wiring 20 is enhanced, and crystallinity of the laminated first ferromagnetic layer 1 is enhanced. The first ferromagnetic layer 1 having high crystallinity has a significant coercivity, and thus, a data retention stability of the magnetoresistance effect element 100 is enhanced. Meanwhile, when the average thickness of the spin-orbit torque wiring 20 is sufficiently small, efficiency of injecting spins into the first ferromagnetic layer 1 is enhanced. There are many cases in which a heavy metal constituting the spin-orbit torque wiring 20 has a short spin diffusion length so that a generated spin current can be efficiently injected into the first ferromagnetic layer 1 by reducing the thickness of the spin-orbit torque wiring 20. For example, when the thickness of the spin-orbit torque wiring 20 is small, a spin current generated in a portion of the spin-orbit torque wiring 20 far from the first ferromagnetic layer 1 also arrives at the first ferromagnetic layer 1 without being diffused inside the spin-orbit torque wiring 20.

The spin-orbit torque wiring 20 generates a spin current due to a spin Hall effect occurring when a current I flows and injects spins into the first ferromagnetic layer 1. For example, the spin-orbit torque wiring 20 applies an SOT for magnetization of the first ferromagnetic layer 1 by an amount with which magnetization of the first ferromagnetic layer 1 can be inverted. A spin Hall effect is a phenomenon in which a spin current is induced in a direction orthogonal to a direction in which a current flows based on a spin-orbit interaction when a current is caused to flow. A spin Hall effect is the same as a normal Hall effect in that a moving (traveling) direction of moving (traveling) charges (electrons) is bent.

In a normal Hall effect, the moving direction of charged particles moving in a magnetic field is bent due to a Lorentz force. In contrast, in a spin Hall effect, even if no magnetic field is present, the traveling direction of spins is bent simply due to traveling electrons (flowing currents).

The spin-orbit torque wiring 20 has spin generation layers 20A and an insertion layer 20B. The spin-orbit torque wiring 20 is a laminate in which the spin generation layers 20A and the insertion layer 20B are laminated in the z direction. There are two or more spin generation layers 20A, and there are one or more insertion layers 20B. The insertion layer 20B is located between the spin generation layers 20A in the z direction. The spin generation layers 20A are examples of first layers, and the insertion layer 20B is an example of a second layer.

For example, the spin generation layers 20A include a nonmagnetic heavy metal as a main component. A heavy metal denotes a metal having a specific gravity greater than that of yttrium (Y). For example, a nonmagnetic heavy metal is a nonmagnetic metal having d electrons or f electrons in an outermost shell and having a large atomic number (the atomic number 39 or larger).

For example, the spin generation layers 20A include any element selected from the group consisting of Mo, Ru, Rh, Pd, Ta, W, Ir, Pt, Au, and Bi. For example, the spin generation layers 20A are formed of any of a metal of any element selected from the group consisting of Mo, Ru, Rh, Pd, Ta, W, Ir, Pt, Au, and Bi; an alloy; an intermetallic compound; a metal boride; a metal carbide; a metal silicide; and a metal phosphide. In a nonmagnetic heavy metal, a spin-orbit interaction stronger than that in other metals occurs. A spin Hall effect occurs due to a spin-orbit interaction, spins are likely to be unevenly distributed inside the spin-orbit torque wiring 20, and a spin current $J_S$ is likely to be generated.

When the current I flows in the spin generation layers 20A, each of a first spin S1 oriented in one direction and a second spin S2 oriented in a direction opposite to that of the first spin S1 is bent due to a spin Hall effect in a direction orthogonal to a direction in which the current I flows. For example, the first spin S1 oriented in a negative y direction is bent in the positive z direction, and the second spin S2 oriented in a positive y direction is bent in the negative z direction.

In a nonmagnetic body (a material which is not a ferromagnetic body), the number of electrons in the first spin S1 and the number of electrons in the second spin S2 generated due to a spin Hall effect are equivalent to each other. That is, the number of electrons in the first spin S1 toward the positive z direction and the number of electrons in the second spin S2 toward the negative z direction are equivalent to each other. The first spin S1 and the second spin S2 flow in a direction in which an uneven distribution of the spins is eliminated. In traveling of the first spin S1 and the second spin S2 in the z direction, since flows of charges cancel each other out, a current amount becomes zero. A spin current accompanying no current is particularly referred to as a pure spin current.

When a flow of electrons in the first spin S1 is expressed as $J_\uparrow$, a flow of electrons in the second spin S2 is expressed as $J_\downarrow$, and a spin current is expressed as $J_S$, these are defined by $J_S = J_\uparrow - J_\downarrow$. The spin current $J_S$ is generated in the z direction. The first spin S1 is injected into the first ferromagnetic layer 1 from the spin generation layers 20A.

Each spin generation layers 20A expand within an xy plane. The thickness of each of the spin generation layers 20A is within a range of 8 Å to 20 Å. The thicknesses of the spin generation layers 20A may be the same as or different from each other.

For example, a film thickness of a first spin generation layer, of the plurality of spin generation layers 20A, closest to the first ferromagnetic layer 1 may be larger than film thicknesses of other spin generation layers 20A. When the spin generation layer 20A in contact with the first ferromagnetic layer 1 is thick, interface magnetic anisotropy of the first ferromagnetic layer 1 becomes strong.

In addition, for example, in a cross section cut along a yz plane, a cross-sectional area of the spin generation layer 20A farther from the first ferromagnetic layer 1 with the insertion layer 20B interposed therebetween may be larger than a cross-sectional area of the spin generation layer 20A closer to the first ferromagnetic layer 1. In addition, for example, in a cross section cut along the xz plane, the cross-sectional area of the spin generation layer 20A farther from the first ferromagnetic layer 1 with the insertion layer 20B interposed therebetween may be larger than the cross-sectional area of the spin generation layer 20A closer to the first ferromagnetic layer 1. The amount of spins reaching the first ferromagnetic layer 1 can be increased and an inversion current density necessary to invert the magnetization of the first ferromagnetic layer 1 can be decreased by generating many spins in the spin generation layer 20A at a position far from the first ferromagnetic layer 1.

The insertion layer 20B is located between the spin generation layers 20A. An electrical resistivity of the insertion layer 20B is lower than electrical resistivities of the spin generation layers 20A.

The insertion layer 20B is constituted of a material having more excellent electrical conductivity than the spin generation layers 20A. For example, the insertion layer 20B includes any element selected from the group consisting of Mg, Al, Si, Ti, Cr, Fe, Co, Cu, Ga, Ge, and Ag. The insertion layer 20B is formed of any of a metal of any element selected from the group consisting of Mg, Al, Si, Ti, Cr, Fe, Co, Cu, Ga, Ge, and Ag; an alloy; an intermetallic compound; a metal boride; a metal carbide; a metal silicide; and a metal phosphide. For example, the insertion layer 20B is a simple substance of Cu or Ag.

In the insertion layer 20B, a spin Hall angle is smaller than that in the spin generation layers 20A and a spin-orbit interaction is unlikely to occur compared to the spin generation layers 20A. That is, the insertion layer 20B is less likely to generate spins to be injected into the first ferromagnetic layer 1 than the spin generation layers 20A. The insertion layer 20B may include an element constituting the spin generation layers 20A. When the insertion layer 20B includes the element constituting the spin generation layers 20A, a spin current generated in the insertion layer 20B can be increased.

For example, the insertion layer 20B expands within the xy plane. For example, the insertion layer 20B extends in the x direction between the non-overlapping regions with the overlapping region interposed therebetween. Since a current is more likely to flow in the insertion layer 20B than in the spin generation layers 20A, a current path in the x direction is ensured, and thus a current is likely to flow in the spin-orbit torque wiring 20.

The thickness of the insertion layer 20B is smaller than the thickness of each of the spin generation layers 20A. It is preferable that the thickness of the insertion layer 20B be half or smaller than the average thickness of the spin generation layers 20A. As described above, electricity is more likely to flow in the insertion layer 20B than in the spin generation layers 20A. In the case in which the thicknesses of the insertion layer 20B and the spin generation layers 20A are the same as each other, a flow dividing ratio to the insertion layer 20B is larger than a flow dividing ratio to the spin generation layers 20A. A spin-orbit interaction is unlikely to occur in the insertion layer 20B compared to the spin generation layers 20A. That is, a great part of spins injected into the first ferromagnetic layer 1 is generated in the spin generation layers 20A. When the flow dividing ratio of a current to the spin generation layers 20A is increased, the amount of spins injected into the first ferromagnetic layer 1 increases.

For example, the thickness of the insertion layer 20B is equal to or smaller than the spin diffusion length in a material constituting the insertion layer 20B. The spin diffusion length is a distance for electrons to be able to travel while retaining information of spins. In addition, for example, the thickness of the insertion layer 20B is equal to or smaller than five times a coupling radius of an element constituting the insertion layer 20B. A coupling radius is a value corresponding to half a distance between nearest atoms in a crystal of the element constituting the insertion layer 20B. A coupling radius can be calculated from the sizes of crystal lattices described in the database (https://crystdb.nims.go.jp/) of National Institute for Materials Science (NEVIS). Even if the insertion layer 20B is not crystallized, a coupling radius is calculated from the sizes of the crystal lattices. Specifically, the thickness of the insertion layer 20B is 10 Å or smaller, for example. When the thickness of the insertion layer 20B is sufficiently smaller, spins generated in the spin generation layer 20A at a position farther from the first ferromagnetic layer 1 can also reach the first ferromagnetic layer 1, and thus the amount of spins injected into the first ferromagnetic layer 1 increases.

The element constituting the insertion layer 20B may diffuse inside the spin generation layers 20A during film formation or after film formation of the insertion layer 20B. The element constituting the insertion layer 20B which has diffused inside the spin generation layers 20A is distributed in the Z direction with respect to the insertion layer 20B, for example. In this case as well, since the element constituting the insertion layer 20B having a low electrical resistivity scatters in the X direction (current path), the resistance decreases. Regarding a method for diffusing the insertion layer 20B during film formation, for example, a substrate being subjected to film formation may be heated, or the insertion layer 20B may be subjected to film formation at a high rate. A temperature for heating a substrate is preferably 100° C. or higher and more preferably 150° C. or higher. A film formation rate of the insertion layer 20B is preferably 0.7 Å/sec or higher and more preferably 1.0 Å/sec or higher. Regarding a method for diffusing the insertion layer 20B after film formation, for example, post-heating may be performed in a thin film state after film formation, or post-heating may be performed in a state in which a magnetoresistance effect element is formed. A temperature of post-heating is preferably 300° C. or higher and more preferably 350° C. or higher.

In addition, the spin-orbit torque wiring 20 may be formed of a composite material of the element constituting the spin generation layers 20A and the element constituting the insertion layer 20B. In addition, the insertion layer 20B may be a composite material of the element constituting the spin generation layers 20A and the element constituting the insertion layer 20B. A composite material may be in a state in which the element constituting the spin generation layers 20A and the element constituting the insertion layer 20B are melted as an alloy (an alloy, an intermetallic compound, or the like), or regions constituted of the element constituting the insertion layer 20B may scatter inside the spin generation layers 20A (base materials) in a cluster state. Regarding a method for making a composite material of spin generation layers and an insertion layer, for example, sputtering may be performed for the element constituting the spin generation layers 20A and the element constituting the insertion layer 20B at the same time when a spin-orbit torque wiring is subjected to film formation, or sputtering may be performed using a target material in which the element constituting the spin generation layers 20A and the element constituting the insertion layer 20B are mixed.

Furthermore, the spin-orbit torque wiring 20 may include a magnetic metal. A magnetic metal is a ferromagnetic metal or an antiferromagnetic metal. A minute amount of a magnetic metal included in a nonmagnetic body may become a scattering factor of spins. For example, a minute amount indicates 3% or smaller than a total mole ratio of an element consisting the spin-orbit torque wiring 20. When spins scatter due to a magnetic metal, a spin-orbit interaction increases, and generation efficiency of a spin current with respect to a current is enhanced.

The spin-orbit torque wiring 20 may include a topological insulator. A topological insulator is formed of a material in which the interior of the material is an insulator or a high-resistance body and a spin-polarized metal state is generated on its surface. An internal magnetic field is generated in a topological insulator due to a spin-orbit interaction. In a topological insulator, a new topological phase develops due to an effect of a spin-orbit interaction even if there is no an external magnetic field. A topological insulator can generate a pure spin current with high efficiency due to a strong spin-orbit interaction and breaking of inversion symmetry at an edge.

For example, a topological insulator is formed of SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$ or the like. A topological insulator can generate a spin current with high efficiency.

Next, operation of the magnetoresistance effect element 100 according to the first embodiment will be described. The magnetoresistance effect element 100 performs operation of writing data and operation of reading data.

First, operation of recording data in the magnetoresistance effect element 100 will be described. First, the first switching element 110 and the second switching element 120 connected to the magnetoresistance effect element 100 in which data is intended to be recorded are turned on. When the first switching element 110 and the second switching element 120 are turned on, a writing current flows in the spin-orbit torque wiring 20. When a writing current flows in the spin-orbit torque wiring 20, a spin Hall effect occurs, and spins are injected into the first ferromagnetic layer 1. Spins injected into the first ferromagnetic layer 1 apply a spin-orbit torque (SOT) to magnetization of the first ferromagnetic layer 1 and change the orientation direction of the magnetization M1 of the first ferromagnetic layer 1.

When a flowing direction of a current is reversed, the direction of spins injected into the first ferromagnetic layer 1 is reversed, and thus the orientation direction of the magnetization M1 can be freely controlled.

The resistance value of resistance variation part 10 in the lamination direction is small when the magnetization M1 of the first ferromagnetic layer 1 and the magnetization M2 of the second ferromagnetic layer 2 are parallel to each other, and is large when the magnetization M1 of the first ferromagnetic layer 1 and the magnetization M2 of the second ferromagnetic layer 2 are anti-parallel to each other. Data is recorded in the magnetoresistance effect element 100 as the resistance value of the resistance variation part 10 in the lamination direction.

Next, operation of reading data from the magnetoresistance effect element 100 will be described. First, the first switching element 110 or the second switching element 120 and the third switching element 130 connected to the magnetoresistance effect element 100 in which data is intended to be recorded are turned on. When each of the switching elements is set in this manner, a reading current flows in the lamination direction of the resistance variation part 10. When the resistance value of the resistance variation part 10 in the lamination direction varies due to the Ohm's law, an output voltage varies. For this reason, for example, data recorded in the magnetoresistance effect element 100 can be read by reading a voltage in the lamination direction of the resistance variation part 10.

Next, a method for manufacturing the magnetoresistance effect element 100 will be described. The magnetoresistance effect element 100 is formed through a step of laminating layers and a processing step of processing a portion of each layer into a predetermined shape. Each layer can be laminated using a sputtering method, a chemical vapor deposition (CVD) method, an electron beam evaporation method (EB evaporation method), an atom laser deposition method, or the like. Each layer can be processed using photolithography or the like.

First, the source S and the drain D are formed by doping impurities in a predetermined position of the substrate Sub.

Next, the gate insulating film GI and the gate electrode G are formed between the source S and the drain D.

The source S, the drain D, the gate insulating film GI, and the gate electrode G become the transistors Tr.

Next, the insulating layer 90 is formed such that the transistors Tr are covered. In addition, an opening part is formed in the insulating layer 90, and the conductive part Cw is formed by filling the inside of the opening part with a conductor. The writing wirings Wp and the common wirings Cm are formed by laminating the insulating layer 90 up to a predetermined thickness, forming a groove in the insulating layer 90 thereafter, and filling the groove with a conductor.

Next, a wiring layer, a ferromagnetic layer, a nonmagnetic layer, and the ferromagnetic layer are laminated in order on a surface of each of the insulating layer 90 and the conductive part Cw. Then, the spin-orbit torque wiring 20, the first ferromagnetic layer 1, the nonmagnetic layer 3, and the second ferromagnetic layer 2 are produced by processing these into a predetermined shape. Other portions are filled with the insulating layer 90, and the magnetoresistance effect element 100 is obtained by producing the electrode E at the end.

The spin generation layers 20A and the insertion layer 20B of the produced spin-orbit torque wiring 20 can be observed using a transmission electron microscope (TEM) and an energy dispersive X-ray analysis (EDS). When EDS compositional mapping is performed using an electron beam having a diameter of 1 nm or smaller with respect to the spin-orbit torque wiring 20 which has been made into a thin piece having a thickness of 20 nm or smaller in the Y direction, the insertion layer 20B interposed between the spin generation layers 20A can be confirmed in a layered state. Meanwhile, in a case in which it is made into a thin piece thicker than 20 nm, depth composition information is superimposed, and thus it may seem to be distributed in a non-uniform manner instead of being in a layered state. In addition, in a case in which it is observed with an electron beam having a diameter larger than 1 nm, energy of adjacent elements is superimposed, and thus it may seem to be distributed in a non-uniform manner instead of being in a layered state.

In the magnetic recording array 200 and the magnetoresistance effect element 100 according to the first embodiment, the spin-orbit torque wiring 20 has the insertion layer 20B, and thus a voltage for writing data can be reduced. Since the insertion layer 20B has more excellent electrical conductivity than the spin generation layers 20A, electrical conductivity of the spin-orbit torque wiring 20 is improved by inserting the insertion layer 20B thereinto. When electrical conductivity of the spin-orbit torque wiring 20 is improved, a sufficient current flows inside the spin-orbit torque wiring 20 even if the potential difference between both ends of the spin-orbit torque wiring 20 is small. Whether or not the magnetization M1 of the first ferromagnetic layer 1 is inverted depends on the current density of a current flowing in the spin-orbit torque wiring 20. Even if a writing voltage is low, a current having a sufficient current density flows in the spin-orbit torque wiring 20 by providing the insertion layer 20B in the spin-orbit torque wiring 20.

Meanwhile, in the insertion layer 20B, as described above, a spin-orbit interaction is unlikely to occur and generation efficiency of spins injected into the first ferromagnetic layer 1 is low compared to the spin generation layers 20A. The magnetization M1 of the first ferromagnetic layer 1 is inverted due to a torque applied by injected spins. When the insertion layer 20B is provided in the spin-orbit torque wiring 20, there is concern that the amount of spins injected into the first ferromagnetic layer 1 may decrease and the magnetization M1 of the first ferromagnetic layer 1 is unlikely to be inverted. It is possible to curb flowing of an excessive current in the insertion layer 20B by further reducing the thickness of the insertion layer 20B than the thicknesses of the spin generation layers 20A. When a large quantity of currents flow in the spin generation layers 20A, the amount of spins injected into the first ferromagnetic layer 1 can be ensured, and a voltage for writing data can be reduced by the insertion layer 20B.

Moreover, when a voltage for writing data is reduced, the size of the transistor Tr for operating the magnetoresistance effect element 100 can be reduced. Specifically, the size of the transistor Tr indicates a source-drain distance. According to the current technology level, the size of the transistor Tr in the magnetic recording array 200 is larger than the size of the magnetoresistance effect element 100. For this reason, integration of the magnetic recording array 200 is often limited by the size of the transistor Tr. When the size of the transistor Tr can be reduced, integration of the magnetic recording array 200 is improved.

Hereinabove, an example of the first embodiment has been described in detail, but the first embodiment is not limited to this example. Various modifications and changes can be made within the scope of the gist of the present invention disclosed in the claims.

First Modification Example

Figure 5:
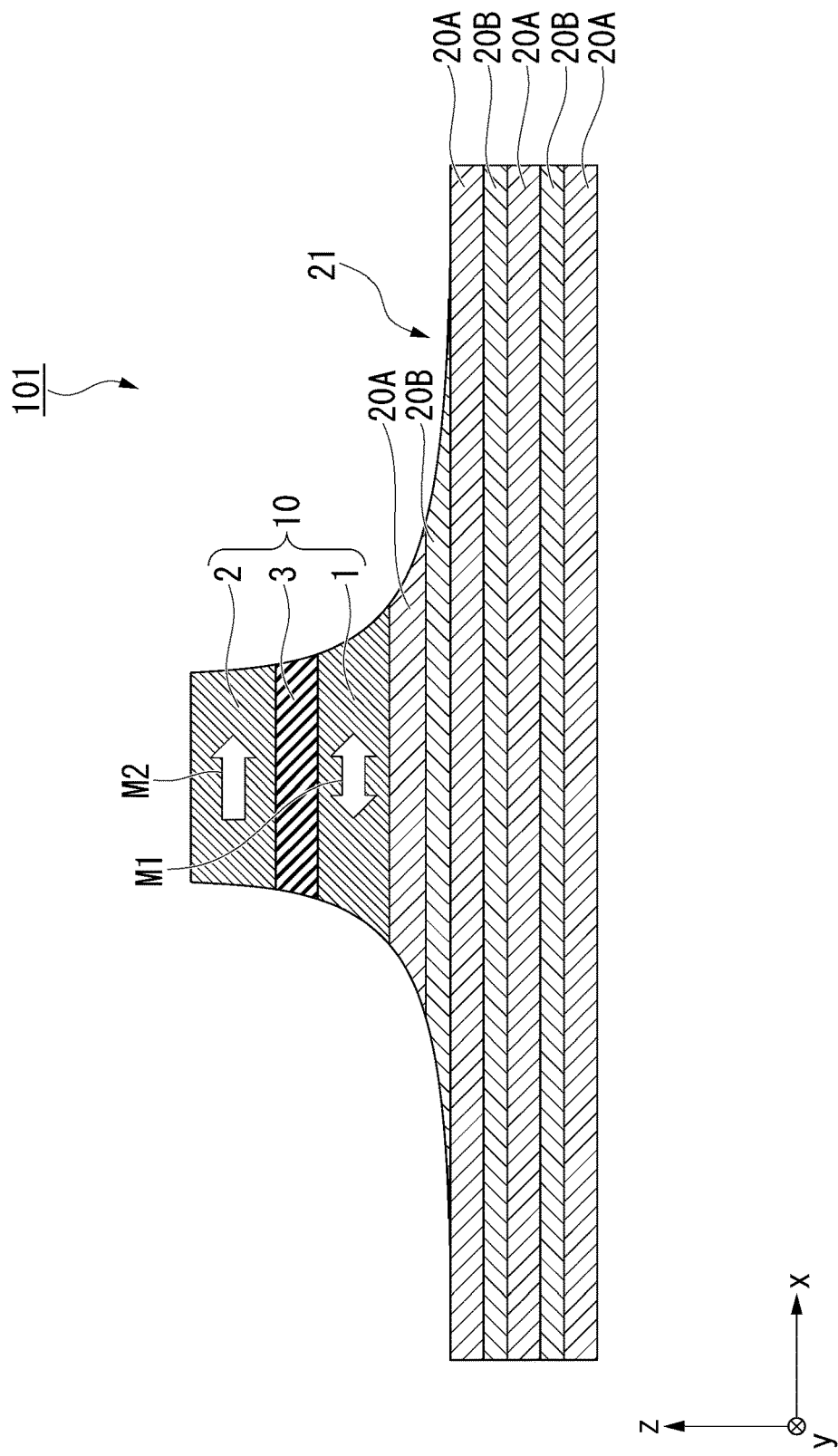
FIG. 5 is a cross-sectional view of a magnetoresistance effect element according to a first modification example.

FIG. 5 is a cross-sectional view of a magnetoresistance effect element 101 according to a first modification example. The magnetoresistance effect element 101 according to the first modification example differs from the magnetoresistance effect element 100 illustrated in FIG. 3 in that a spin-orbit torque wiring 21 has a plurality of insertion layers 20B. The same reference signs are applied to constituents similar to those of the magnetoresistance effect element 100 illustrated in FIG. 3, and description thereof will be omitted.

The spin-orbit torque wiring 21 has a plurality of spin generation layers 20A and a plurality of insertion layers 20B. Each of the plurality of insertion layers 20B is inserted between the spin generation layers 20A. The spin generation layers 20A and the insertion layers 20B are alternately laminated in the z direction. For example, the number of insertion layers 20B is within a range of two to six. The thicknesses of the insertion layers 20B may be the same as or different from each other.

All the insertion layers 20B illustrated in FIG. 5 extend in the x direction between the non-overlapping regions with the overlapping region interposed therebetween. For example, the insertion layer 20B, of the insertion layers 20B, at a position farthest from the first ferromagnetic layer 1 extends to positions overlapping the conductive parts Cw at both ends of the spin-orbit torque wiring 21, for example. Due to the constitution, a current path in the x direction is ensured, and a current is likely to flow in the spin-orbit torque wiring 21.

Since the magnetoresistance effect element 101 according to the first modification example has the insertion layers 20B, it exhibits effects similar to those of the magnetoresistance effect element 100 illustrated in FIG. 3. In addition, since the number of insertion layers 20B has increased, the number of interfaces between the spin generation layers 20A and the insertion layers 20B increases. When the number of these interfaces increases, it is possible to reduce the inversion current density necessary to invert the magnetization M1 of the first ferromagnetic layer 1 due to an interface Rashba effect.

Second Modification Example

Figure 6:
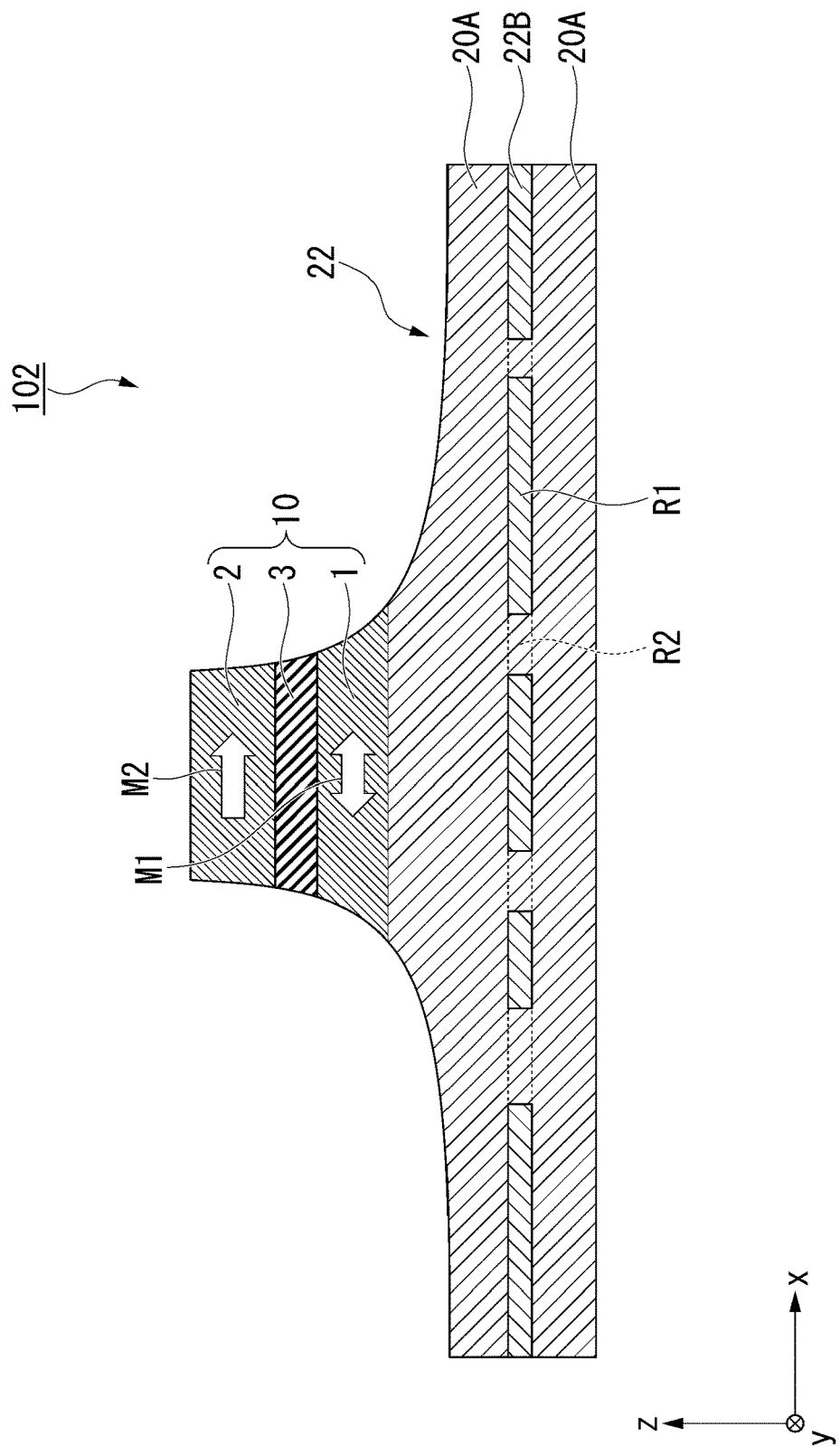
FIG. 6 is a cross-sectional view of a magnetoresistance effect element according to a second modification example.

FIG. 6 is a cross-sectional view of a magnetoresistance effect element 102 according to a second modification example. The magnetoresistance effect element 102 according to the second modification example differs from the magnetoresistance effect element 100 illustrated in FIG. 3 in that an insertion layer 22B of a spin-orbit torque wiring 22 has a first region R1 and second regions R2. The same reference signs are applied to constituents similar to those of the magnetoresistance effect element 100 illustrated in FIG. 3, and description thereof will be omitted.

The insertion layer 22B has the first region R1 and the second regions R2. The first region R1 is constituted of a material similar to that of the insertion layer 20B described above. The second regions R2 are constituted of a material similar to that of the spin generation layers 20A.

Figure 7:
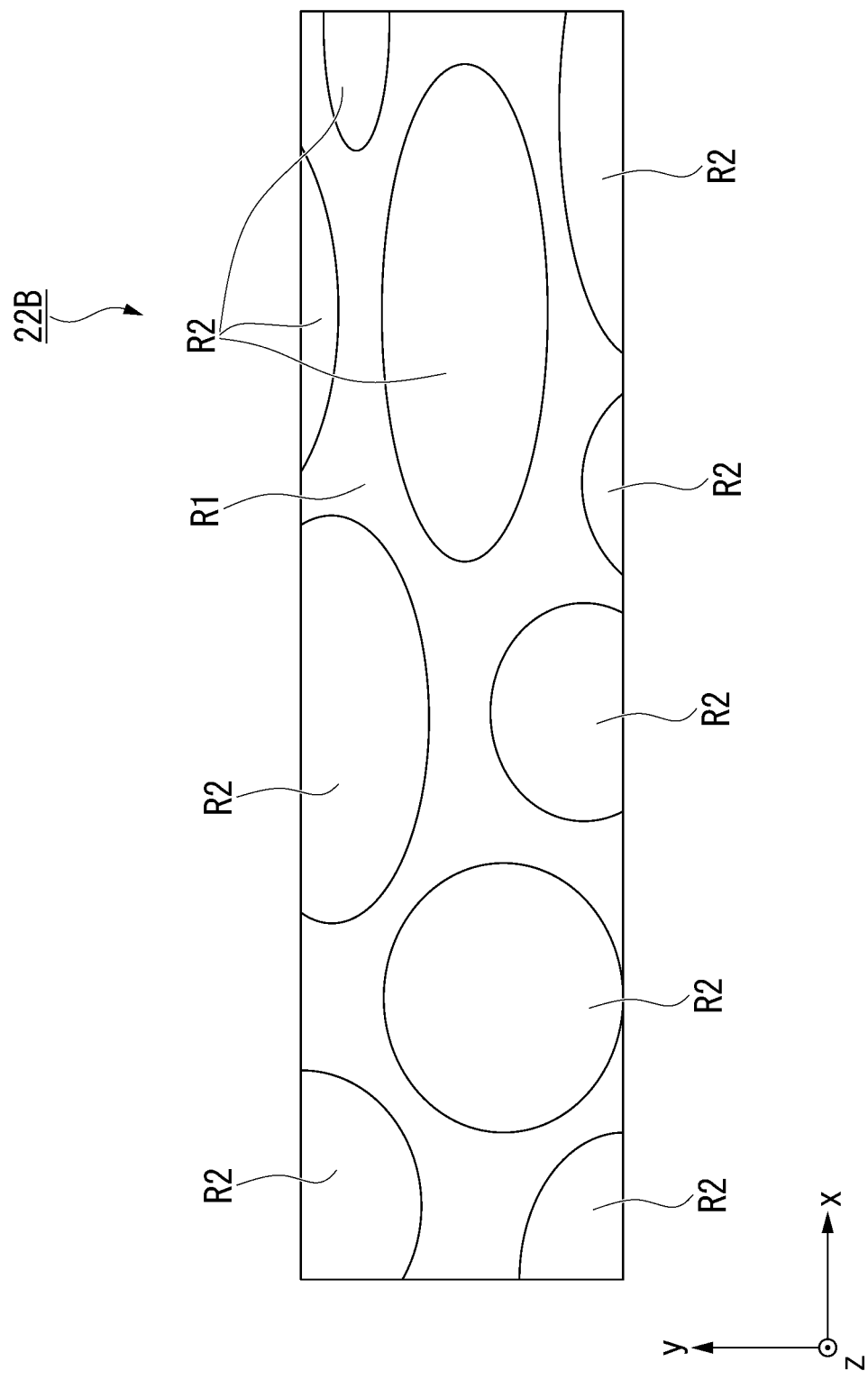
FIG. 7 is a plan view of an insertion layer of the magnetoresistance effect element according to the second modification example.

FIG. 7 is a plan view of the insertion layer 22B according to the second modification example in the z direction. The first region R1 expands within the xy plane, and the second regions R2 are scattered within the xy plane. The first region R1 and the second regions R2 may have an opposite positional relationship therebetween.

Even if the insertion layer 22B is constituted of the same material and is not a homogeneous layer expanding within the xy plane, it has an effect of facilitating a flow of a current. For this reason, the magnetoresistance effect element 102 according to the second modification example exhibits effects similar to those of the magnetoresistance effect element 100 illustrated in FIG. 3 by having the insertion layers 22B.

Figure 8:
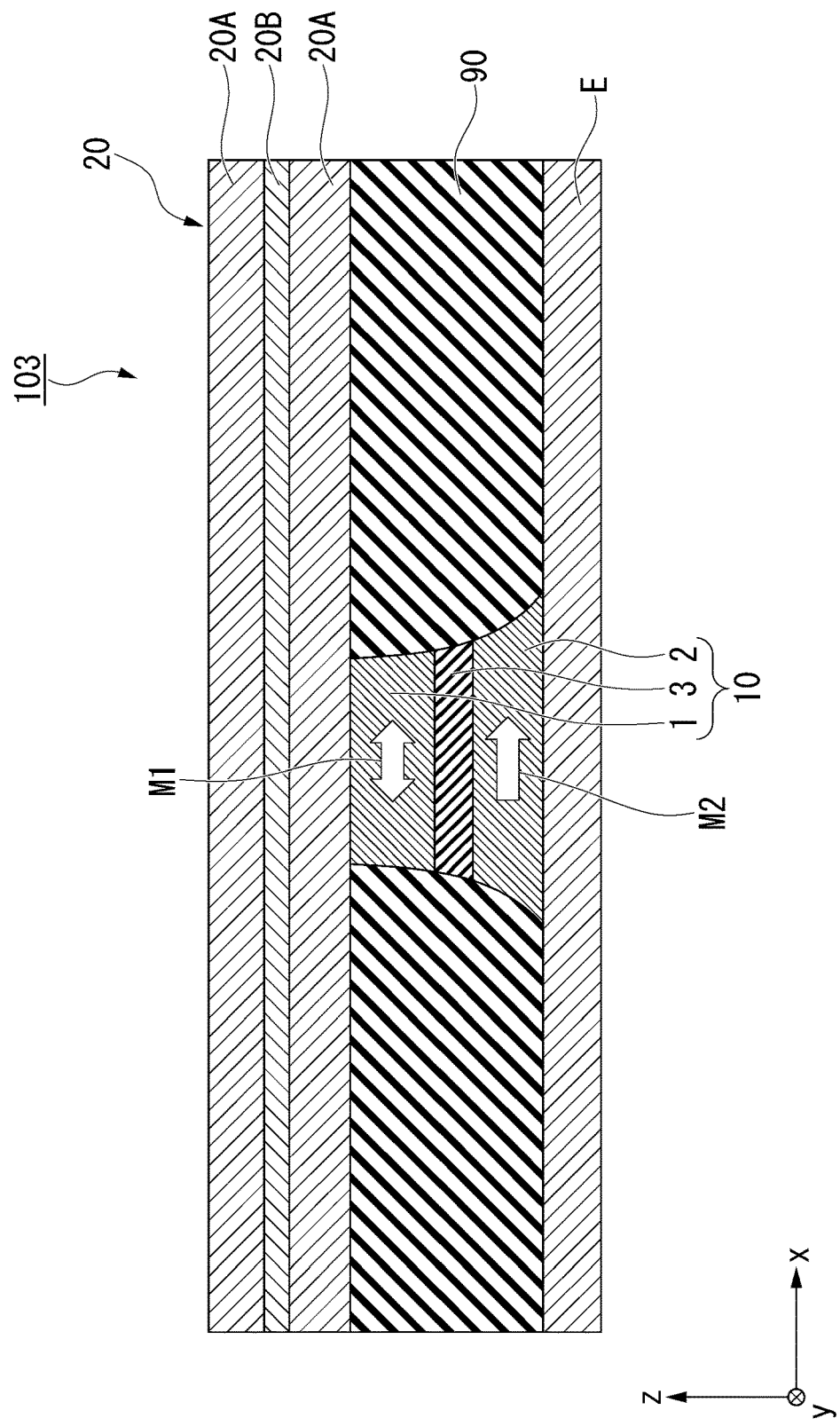
FIG. 8 is a cross-sectional view of a magnetoresistance effect element according to a third modification example.

The first modification example and the second modification example have been presented, but a modification example of the first embodiment is not limited thereto. For example, the magnetoresistance effect element may have a bottom pin structure. FIG. 8 is a cross-sectional view of a magnetoresistance effect element 103 having a bottom pin structure. In the magnetoresistance effect element 103 illustrated in FIG. 8, the resistance variation part 10 and the spin-orbit torque wiring 20 have a reversed positional relationship of that of the magnetoresistance effect element 100 illustrated in FIG. 3.

In the magnetoresistance effect element 103, the spin-orbit torque wiring 20 is laminated on the resistance variation part 10 and the insulating layer 90. In the magnetoresistance effect element 103, the second ferromagnetic layer 2 is closer to the substrate Sub than the first ferromagnetic layer 1. In the magnetoresistance effect element 103, the resistance variation part 10 and the spin-orbit torque wiring 20 simply have a reversed positional relationship, and it performs operation similar to that of the magnetoresistance effect element 100 illustrated in FIG. 3.

Figure 9:
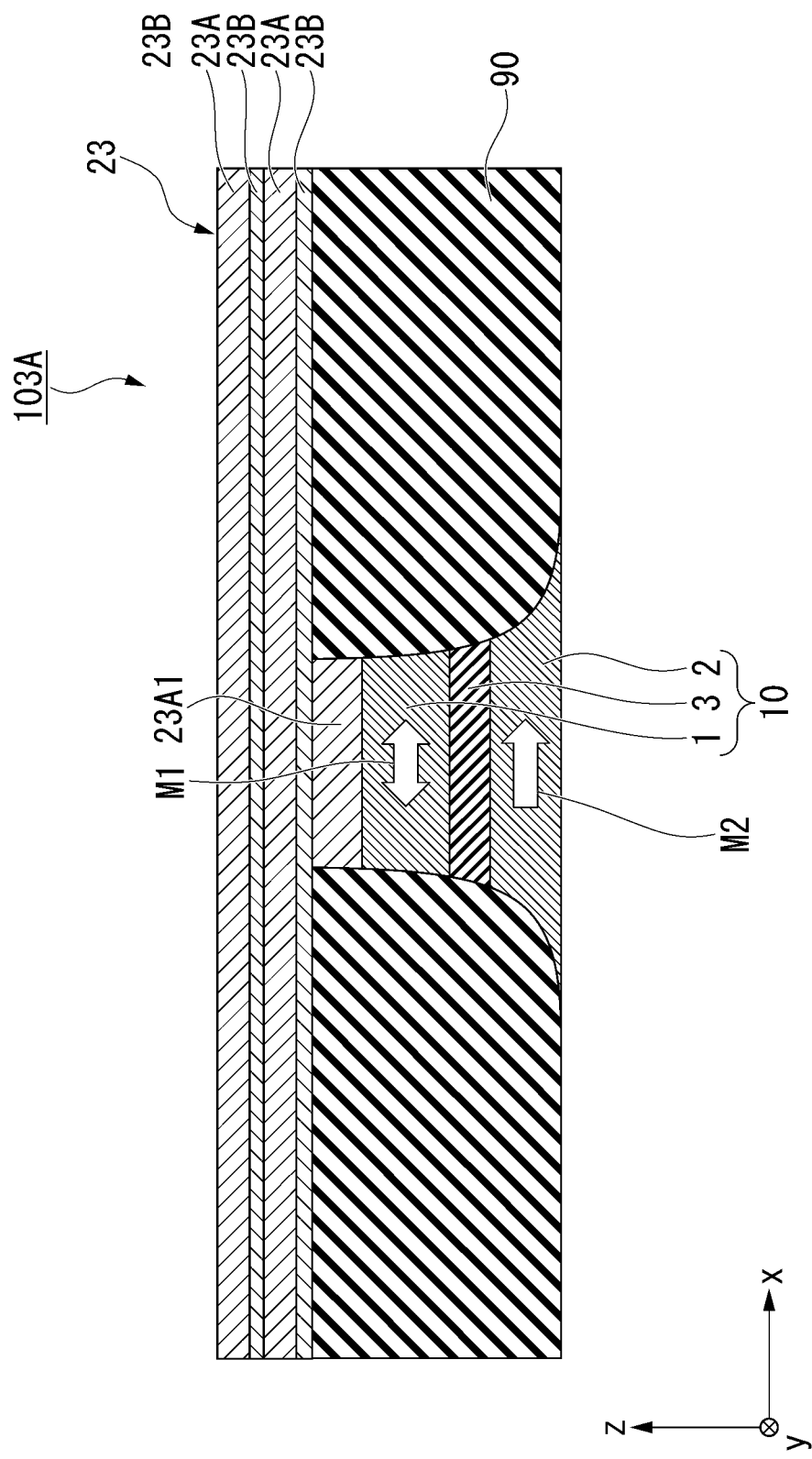
FIG. 9 is a cross-sectional view of another example of a magnetoresistance effect element having a bottom pin structure.

FIG. 9 is a cross-sectional view of another example of a magnetoresistance effect element having a bottom pin structure. In a magnetoresistance effect element 103A illustrated in FIG. 9, a spin-orbit torque wiring 23 is laminated on the resistance variation part 10 and the insulating layer 90. The spin-orbit torque wiring 23 has a plurality of spin generation layers 23A and a plurality of insertion layers 23B. FIG. 9 illustrates a case in which there are a plurality of insertion layers 23B as an example, but one insertion layer 23B may be provided.

The spin generation layer 23A, of the plurality of spin generation layers 23A, closest to the first ferromagnetic layer 1 will hereinafter be referred to as a first spin generation layer 23A1. The film thickness of the first spin generation layer 23A1 is larger than film thicknesses of other spin generation layers 23A. When the first spin generation layer 23A1 has a large film thickness, magnetic anisotropy of the first ferromagnetic layer 1 is enhanced. FIG. 9 illustrates a case in which the magnetization M1 is subjected to in-plane orientation within the xy plane as an example. However, when the magnetization M1 is subjected to perpendicular orientation in the z direction, if the first spin generation layer 23A1 has a large film thickness, magnetic anisotropy of the first ferromagnetic layer 1 is particularly enhanced.

For example, the length of the first spin generation layer 23A1 in the x direction is shorter than the lengths of other spin generation layers 23A in the x direction. A side surface of the first spin generation layer 23A1 may by connected to a side surface of the resistance variation part 10. Connected side surfaces denotes that an inclined angle between contact flat surfaces continuously changes or is constant.

The magnetoresistance effect element 103A illustrated in FIG. 9 can be produced by the following method, for example. The magnetoresistance effect element 103A is manufactured through a film formation step, a processing step, and a wiring forming step.

Figure 10:
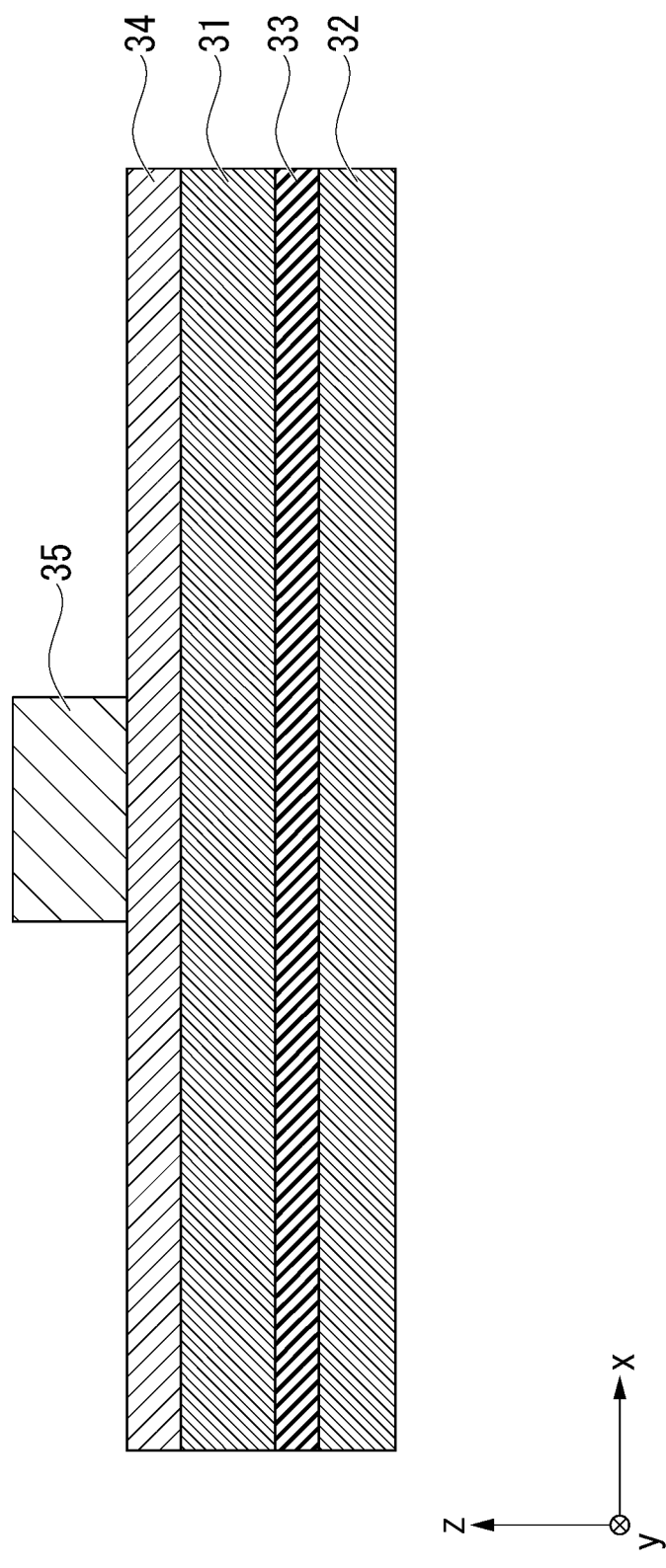
FIG. 10 is a view illustrating an example of a method for manufacturing a magnetoresistance effect element having a bottom pin structure.
Figure 11:
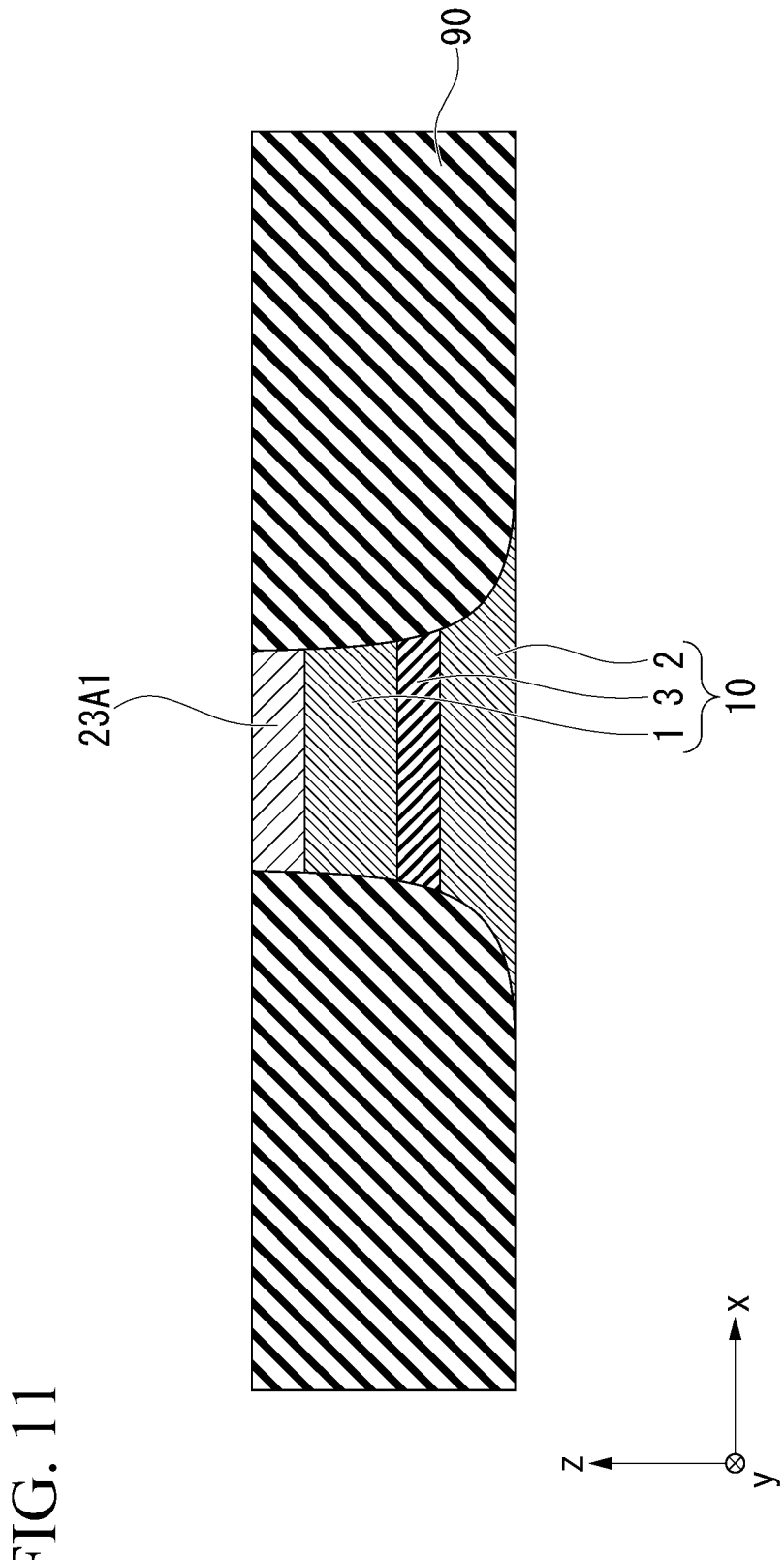
FIG. 11 is a view illustrating another example of the method for manufacturing a magnetoresistance effect element having a bottom pin structure.

First, in the film formation step, as illustrated in FIG. 10, a ferromagnetic layer 32, a nonmagnetic layer 33, a ferromagnetic layer 31, and a conductive layer 34 are laminated in order from the layer on a side closer to the substrate Sub, and a laminate is formed. After processing, the ferromagnetic layer 31 becomes the first ferromagnetic layer 1, the ferromagnetic layer 32 becomes the second ferromagnetic layer 2, the nonmagnetic layer 33 becomes the nonmagnetic layer 3, and the conductive layer 34 becomes the first spin generation layer 23A. For example, each layer is subjected to film formation through sputtering. Further, a hard mask layer 35 is formed in a portion on an upper surface of the conductive layer 34. The hard mask layer 35 may be formed of a material which is the same as or different from that of the conductive layer 34.

Next, in the processing step, etching is performed via the hard mask layer 35, and a columnar body is formed. When the hard mask layer 35 is formed of a material other than materials which can be applied to a spin generation layer 23, the hard mask layer 35 is removed. When the hard mask layer 35 is removed, a portion of the conductive layer 34 becomes the first spin generation layer 23A1. On the other hand, when the hard mask layer 35 is formed of a material which can be applied to the spin generation layer 23, the entirety or a portion of the hard mask layer 35 is removed. When a portion of the hard mask layer 35 is removed, portions of the conductive layer 34 and the hard mask layer 35 become the first spin generation layer 23A1. When the entirety of the hard mask layer 35 is removed, a portion of the conductive layer 34 becomes the first spin generation layer 23A1. After the processing step, the first spin generation layer 23A1 is exposed.

Next, in the wiring forming step, the insertion layer 23B and the spin generation layer 23A are subjected to film formation in order. The film thickness of the spin generation layer 23A is made smaller than the film thickness of the first spin generation layer 23A1. After these layers are subjected to film formation, unnecessary portions in the y direction are removed through etching, and the spin-orbit torque wiring 23 is formed. Through the foregoing procedure, the magnetoresistance effect element 103A is obtained.

Figure 12:
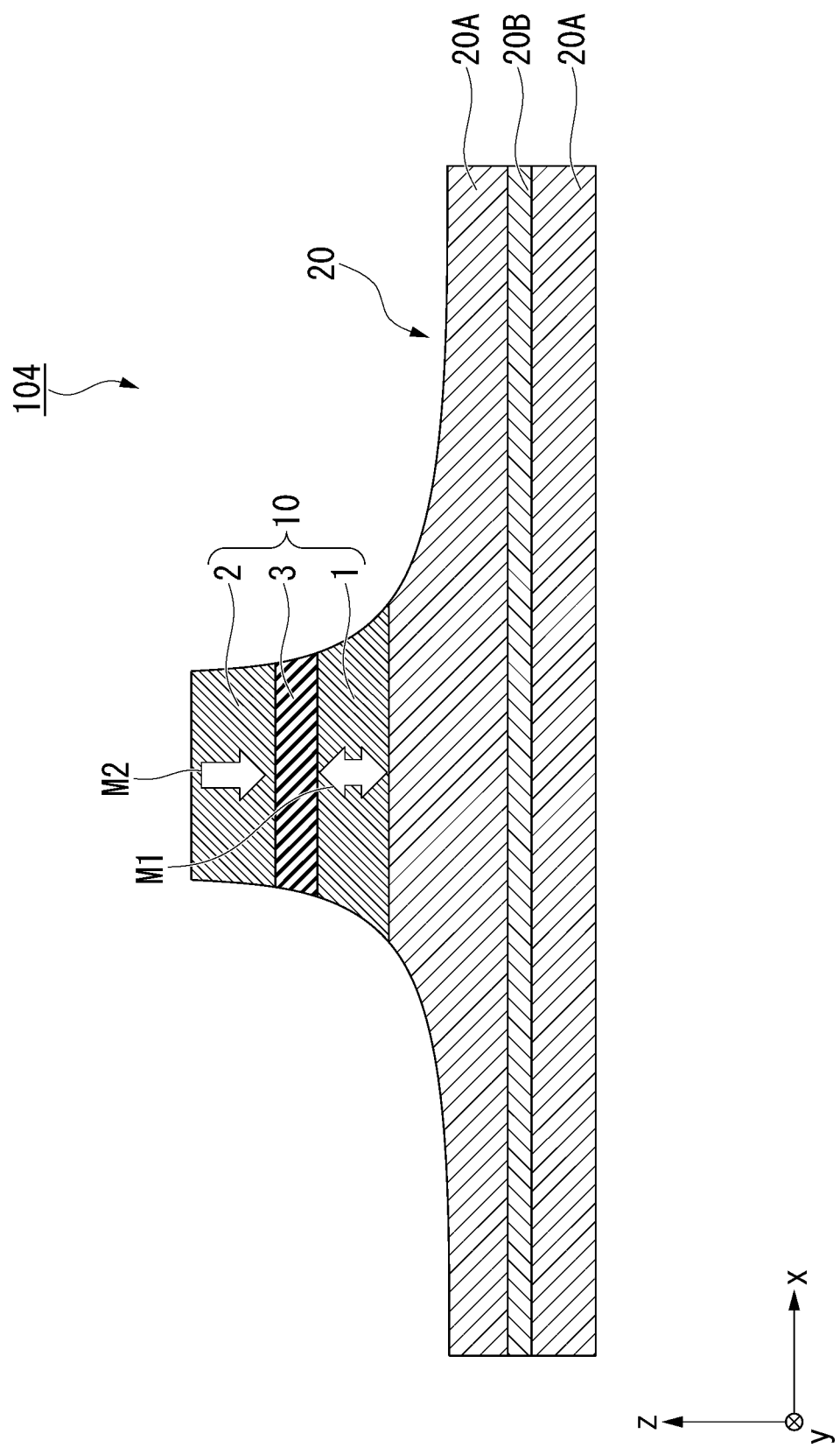
FIG. 12 is a cross-sectional view of a magnetoresistance effect element according to a fourth modification example.
Figure 13:
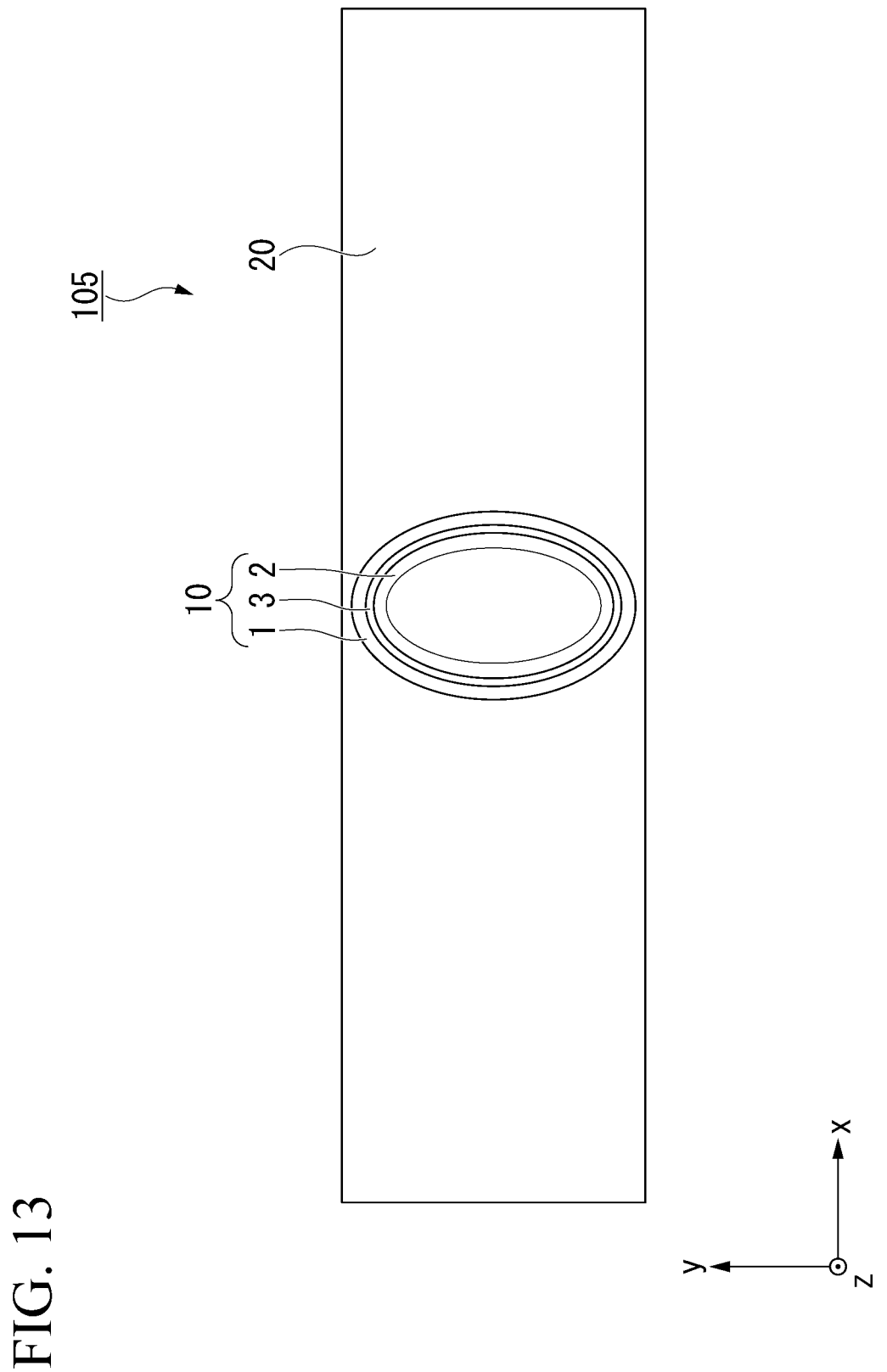
FIG. 13 is a cross-sectional view of a magnetoresistance effect element according to a fifth modification example.
Figure 14:
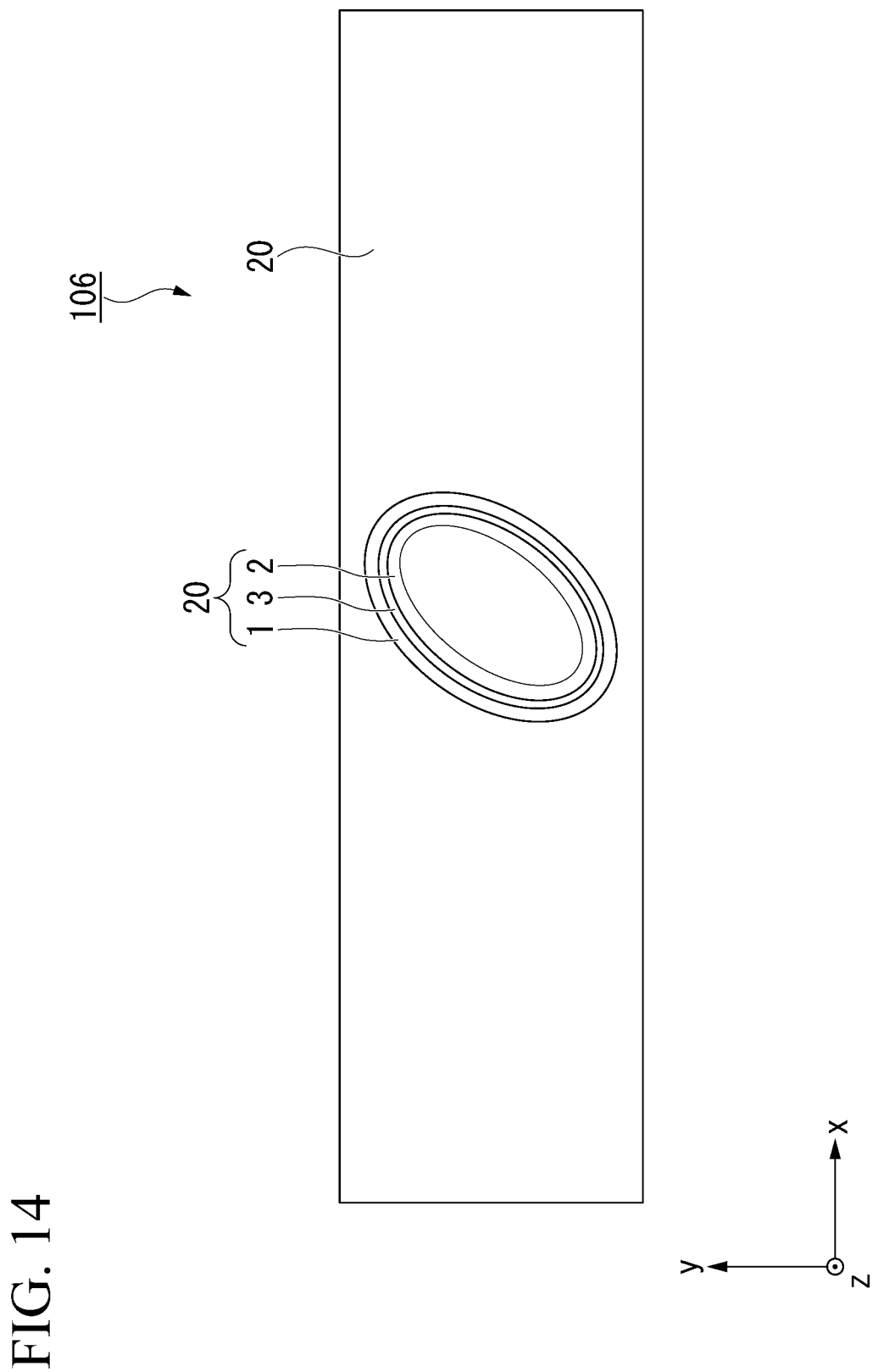
FIG. 14 is a cross-sectional view of a magnetoresistance effect element according to a sixth modification example.

In addition, for example, FIG. 3 illustrates a case in which the magnetizations M1 and M2 are subjected to in-plane orientation within the xy plane as an example. However, as in a magnetoresistance effect element 104 illustrated in FIG. 12, the magnetizations M1 and M2 may be subjected to perpendicular orientation in the z direction. In addition, FIG. 3 illustrates a case in which the shape of the resistance variation part 10 in a plan view is an oval having the major axis in the x direction, as an example. However, as in a magnetoresistance effect element 105 illustrated in FIG. 13, the shape of the resistance variation part 10 in a plan view may be an oval having the major axis in the y direction, or as in a magnetoresistance effect element 106 illustrated in FIG. 14, the shape of the resistance variation part 10 in a plan view may be an oval having the major axis in a direction inclined from the x direction and the y direction. In the case of FIG. 13, the magnetizations M1 and M2 are likely to be oriented in the y direction. In the case of FIG. 14, the magnetizations M1 and M2 are likely to be oriented in the major axis direction of an oval inclined from the x direction and the y direction.

Second Embodiment

Figure 15:
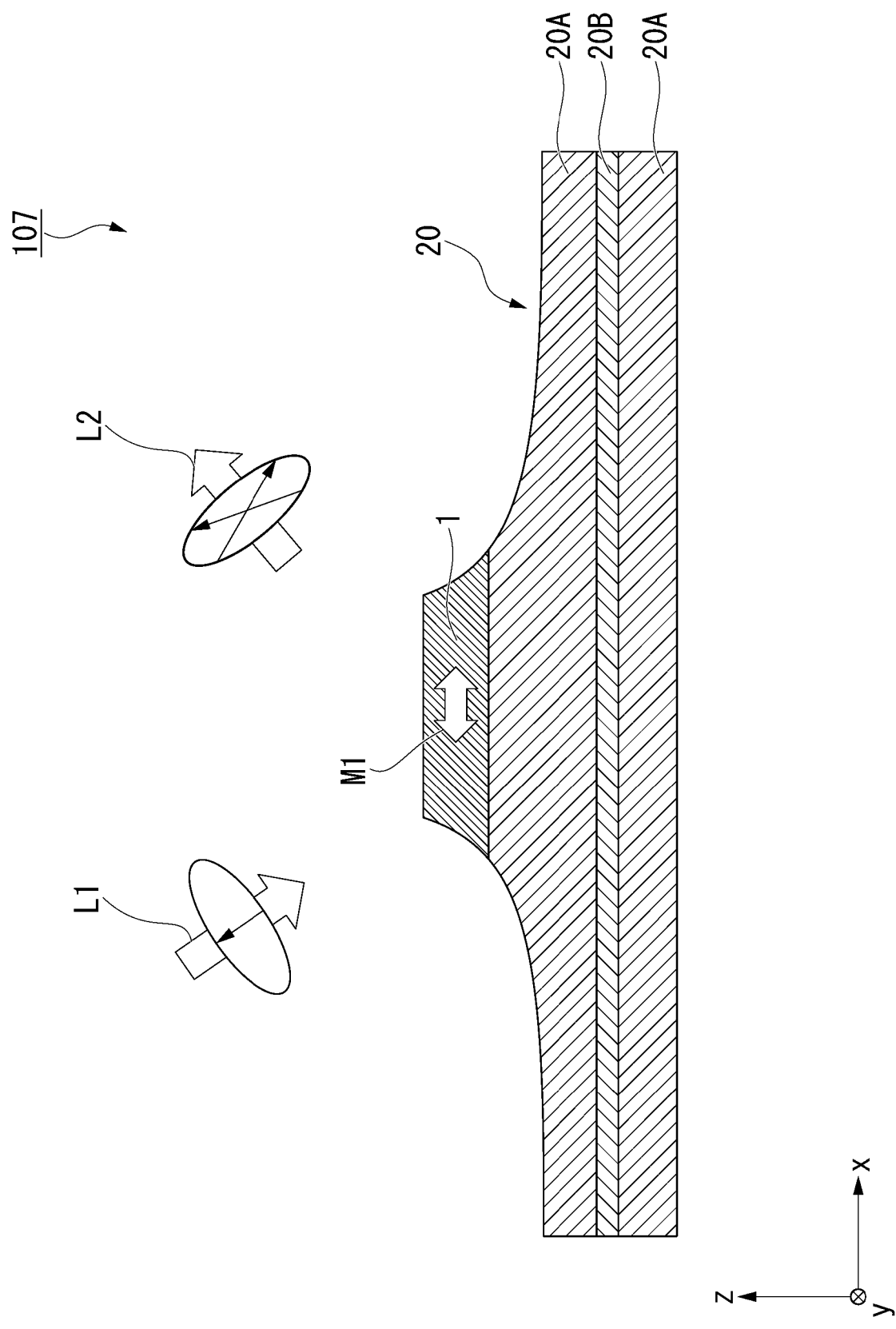
FIG. 15 is a cross-sectional view of a magnetization rotational element according to a second embodiment.

FIG. 15 is a cross-sectional view of a magnetization rotational element 107 according to a second embodiment. FIG. 15 is a cross section of the magnetization rotational element 107 cut along an xz plane passing through the center of the width of the spin-orbit torque wiring 20 in the y direction. The magnetization rotational element 107 according to the second embodiment differs from the magnetoresistance effect element 100 according to the first embodiment in that the nonmagnetic layer 3 and the second ferromagnetic layer 2 are not provided. Other constituents are similar to those of the magnetoresistance effect element 100 according to the first embodiment, and description thereof will be omitted.

The magnetization rotational element 107 causes light L1 to be incident on the first ferromagnetic layer 1 and evaluates light L2 reflected by the first ferromagnetic layer 1. When the orientation direction of magnetization varies due to a magnetic Kerr effect, a deflection state of the reflected light L2 varies. The magnetization rotational element 107 can be used, for example, as an optical element such as a graphic display device utilizing a difference between deflection states of the light L2.

Furthermore, the magnetization rotational element 107 can also be utilized alone as an anisotropy magnetic sensor, an optical element utilizing a magnetic Faraday effect, or the like.

In the magnetization rotational element 107 according to the second embodiment, the nonmagnetic layer 3 and the second ferromagnetic layer 2 are simply excluded, and effects similar to those of the magnetoresistance effect element 100 according to the first embodiment can be achieved.

Hereinabove, the present invention is not limited to the embodiments and the modification examples described above. For example, the modification examples of the first embodiment may be applied to the second embodiment, or the modification examples of the first embodiment may be combined.

EXAMPLES

Example 1

In Example 1, a spin-orbit torque wiring in which an insertion layer was inserted between spin generation layers was produced. The thickness of the spin-orbit torque wiring was set to 5 nm, and the thickness of the insertion layer was set to 0.2 nm. The spin generation layers of the spin-orbit torque wiring were constituted of W, and the insertion layer was formed of Cu or Ag. Further, CoFeB was laminated as a first ferromagnetic layer on a surface of the spin-orbit torque wiring. The first ferromagnetic layer was a column having a diameter of 200 nm. While varying the number of insertion layers, the wiring resistance of the spin-orbit torque wiring, a writing current necessary to invert the magnetization of the first ferromagnetic layer, and a writing voltage necessary to invert the magnetization of the first ferromagnetic layer were measured.

Figure 16:
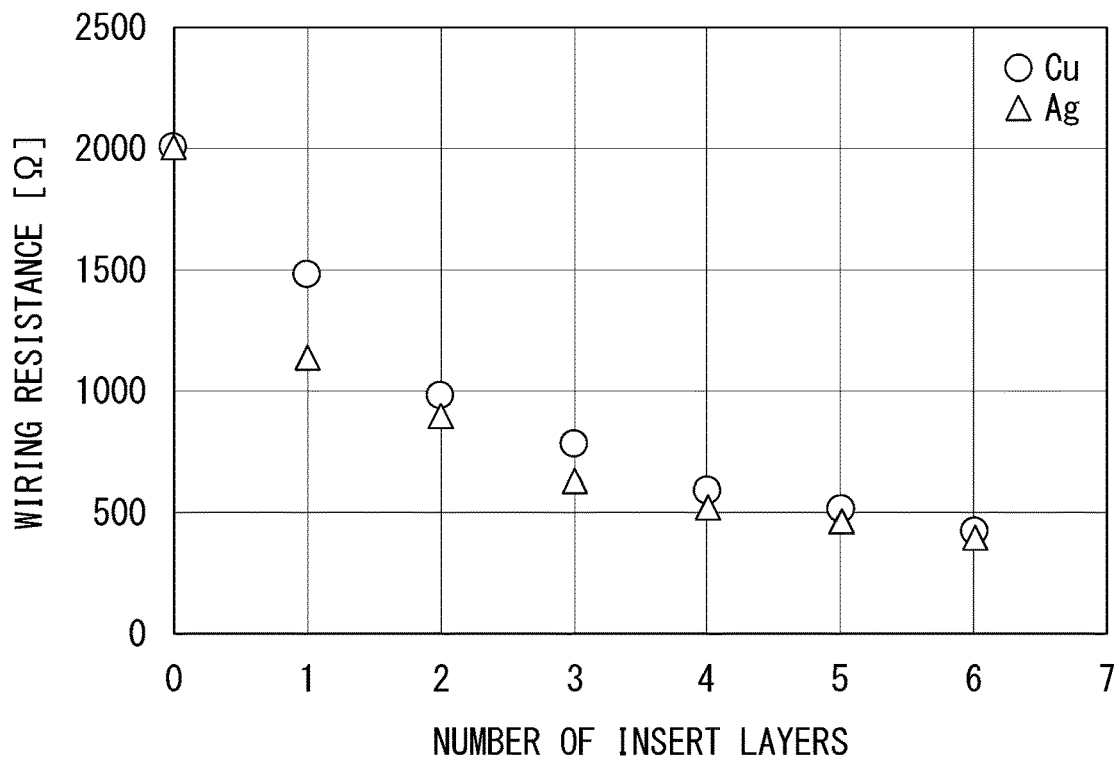
FIG. 16 is a view illustrating a wiring resistance of a spin-orbit torque wiring of Example 1.
Figure 17:
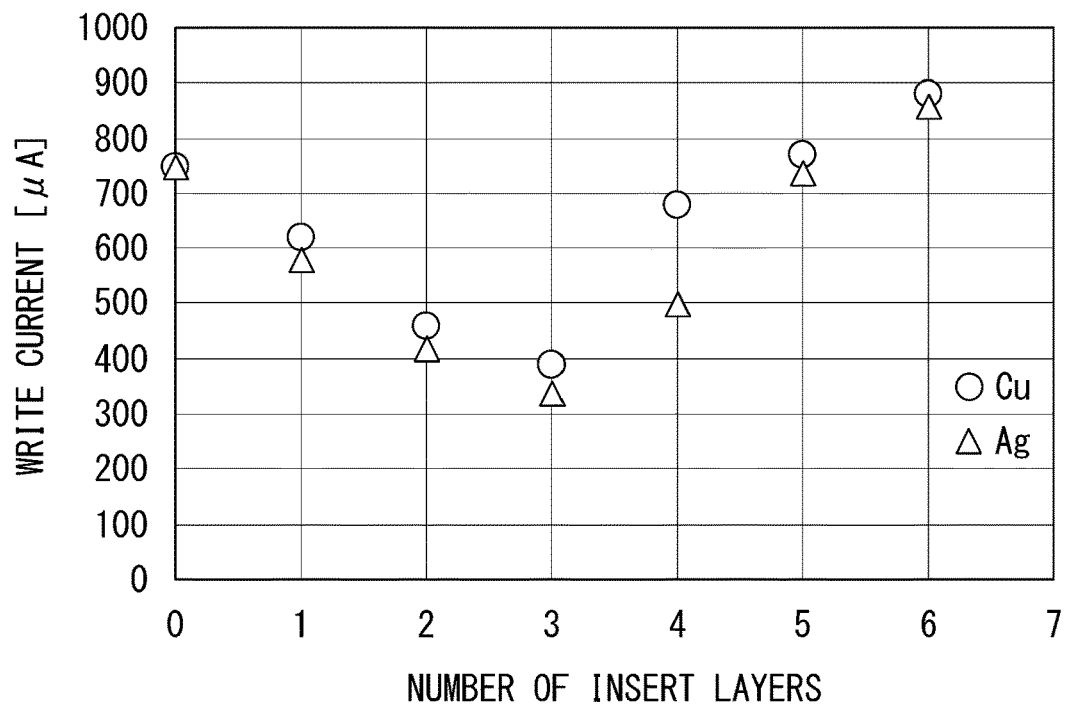
FIG. 17 is a view illustrating a writing current of a magnetoresistance effect element of Example 1.
Figure 18:
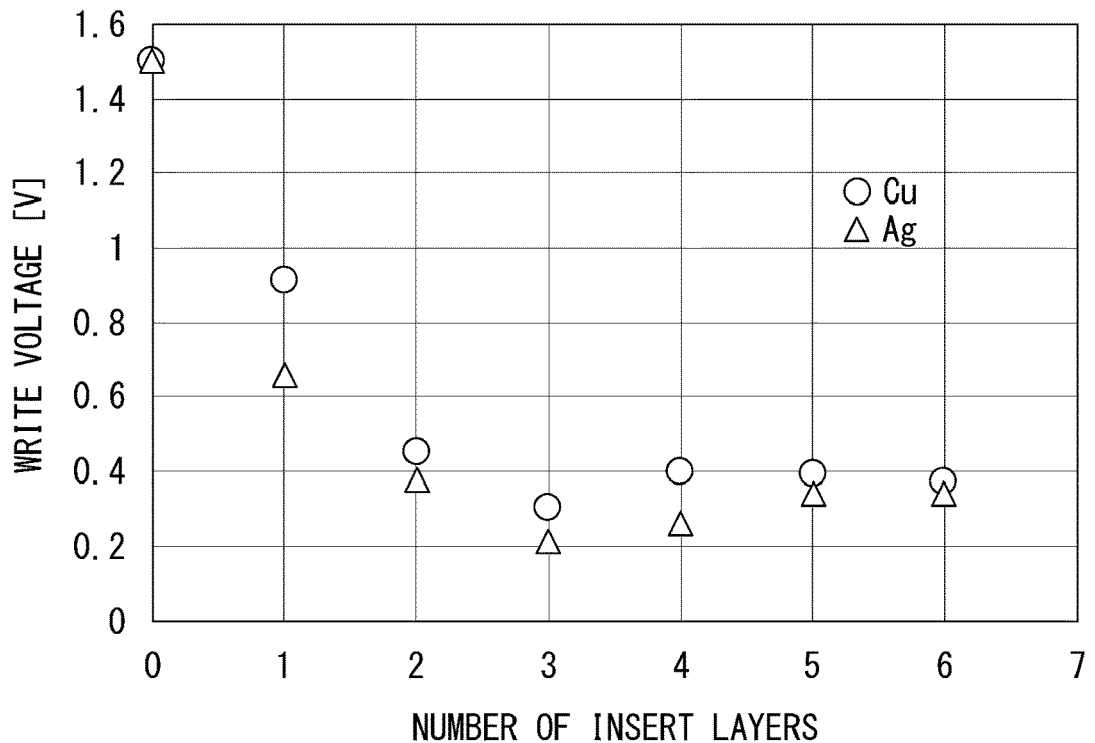
FIG. 18 is a view illustrating a writing voltage of the magnetoresistance effect element of Example 1.

FIG. 16 is a view illustrating a wiring resistance of a spin-orbit torque wiring of Example 1. FIG. 17 is a view illustrating a writing current of the magnetoresistance effect element of Example 1. FIG. 18 is a view illustrating a writing voltage of the magnetoresistance effect element of Example 1.

As illustrated in FIG. 16, it can be seen that the resistance value of the spin-orbit torque wiring has decreased due to the insertion layer provided in the spin-orbit torque wiring. In addition, as illustrated in FIG. 17, the writing current has decreased until the number of insertion layers increases to three, and the writing current has increased after exceeding three layers. It is considered, as a reason therefor, that the amount of current flowing in the spin-orbit torque wiring has increased due to a large quantity of currents flowing in the insertion layer that is unlikely to generate spins injected into the first ferromagnetic layer 1 but the amount of spins injected into the first ferromagnetic layer 1 is not sufficiently ensured. In addition, a current was likely to flow in the spin-orbit torque wiring and the writing voltage decreased by providing the insertion layer as illustrated in FIG. 18.

Example 2

In Example 2, a spin-orbit torque wiring in which an insertion layer was inserted between spin generation layers was produced. The thickness of the spin-orbit torque wiring was set to 5 nm, and the thickness of the insertion layer was varied. The spin generation layers of the spin-orbit torque wiring were constituted of W, and the insertion layer was formed of Cu or Ag. The number of insertion layers was one. Further, CoFeB was laminated as a first ferromagnetic layer on a surface of the spin-orbit torque wiring. The first ferromagnetic layer was a column having a diameter of 200 nm. While varying the number of insertion layers, the wiring resistance of the spin-orbit torque wiring, a writing current necessary to invert the magnetization of the first ferromagnetic layer, and a writing voltage necessary to invert the magnetization of the first ferromagnetic layer were measured.

Figure 19:
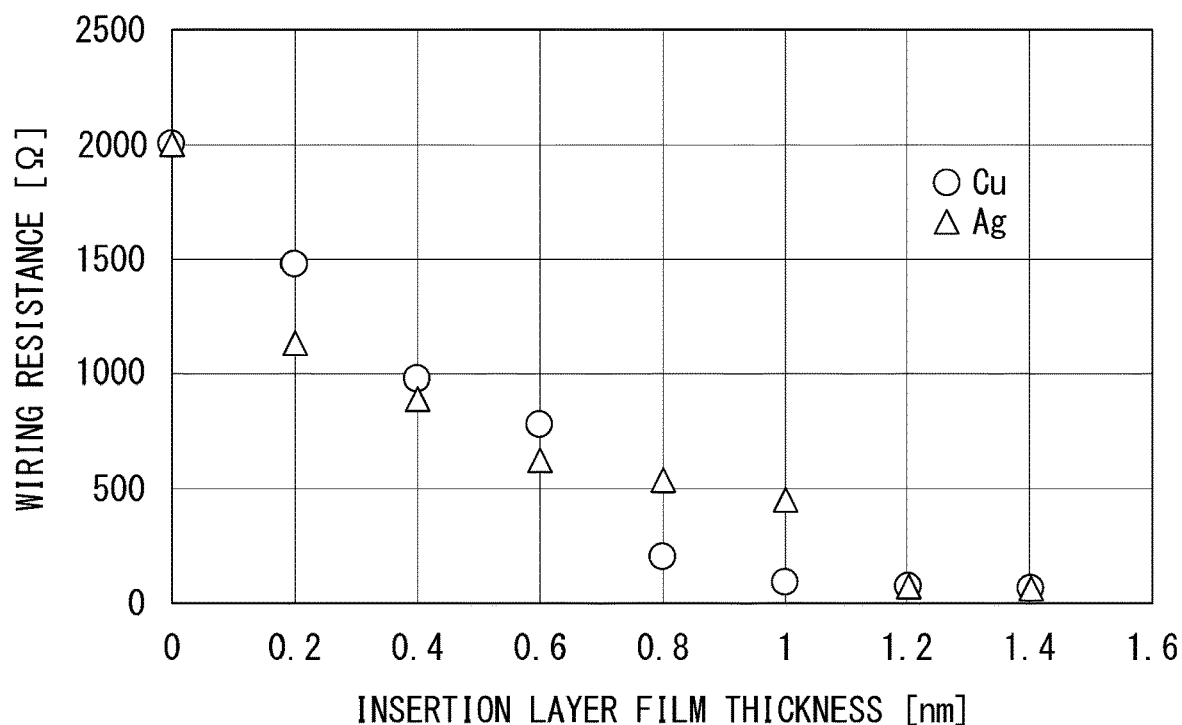
FIG. 19 is a view illustrating a wiring resistance of a spin-orbit torque wiring of Example 2.
Figure 20:
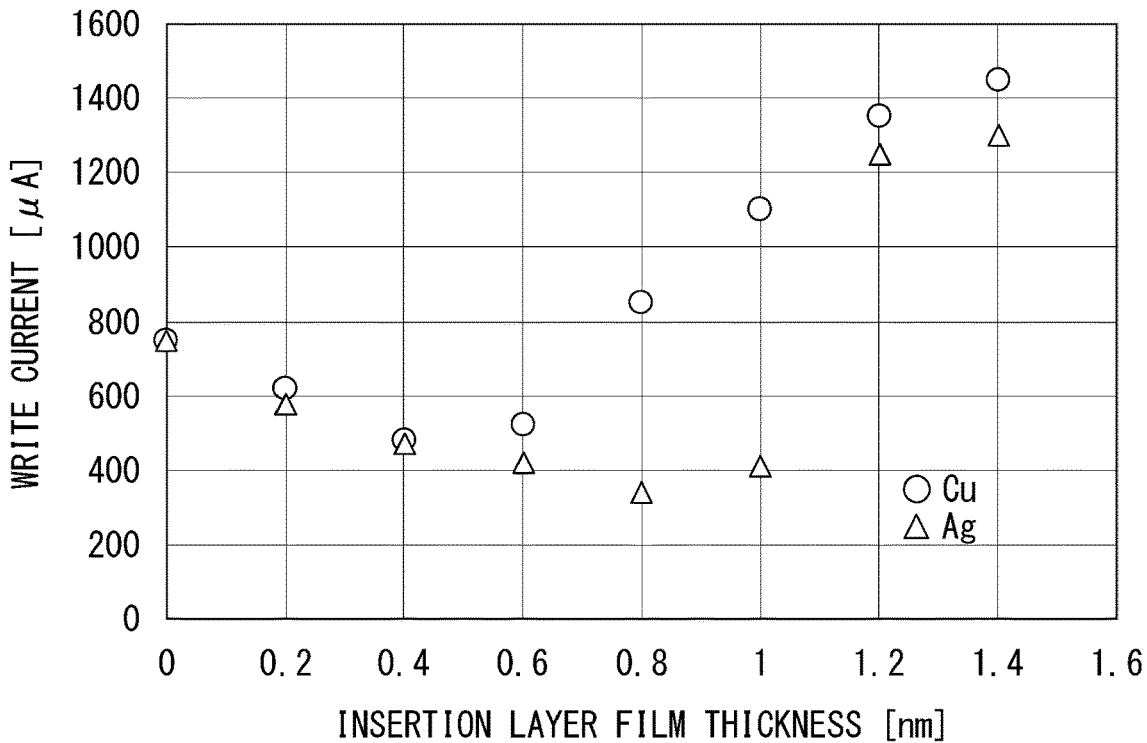
FIG. 20 is a view illustrating a writing current of a magnetoresistance effect element of Example 2.
Figure 21:
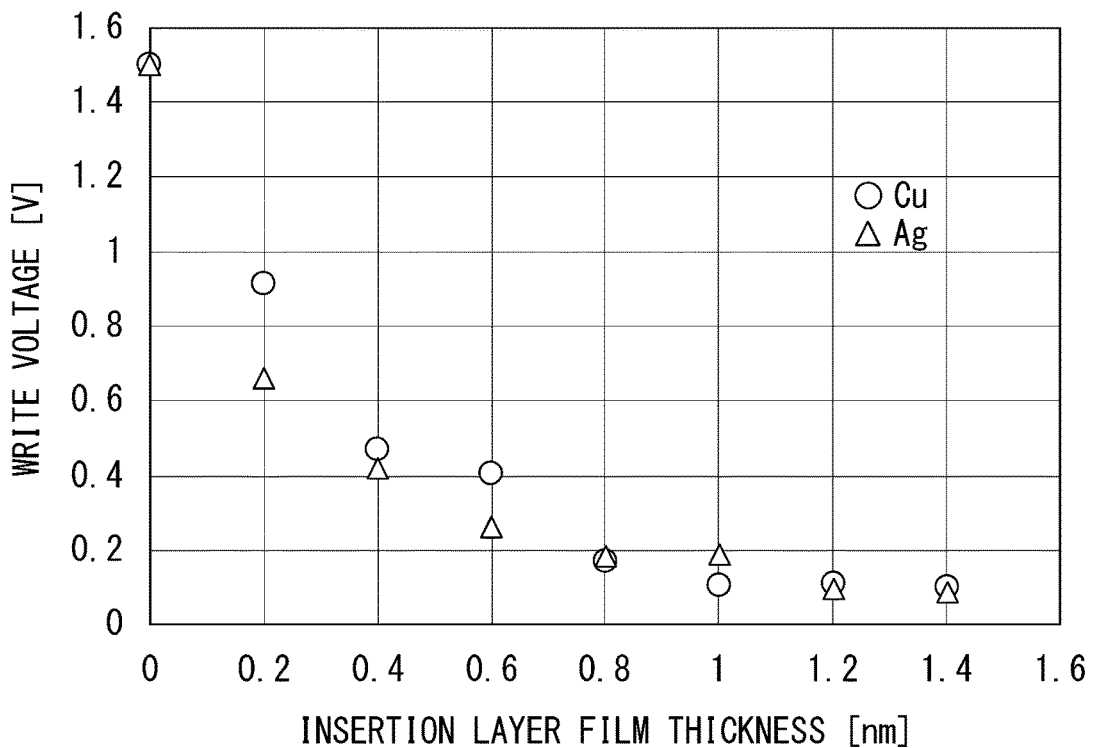
FIG. 21 is a view illustrating a writing voltage of the magnetoresistance effect element of Example 2.

FIG. 19 is a view illustrating a wiring resistance of a spin-orbit torque wiring of Example 2. FIG. 20 is a view illustrating a writing current of the magnetoresistance effect element of Example 2. FIG. 21 is a view illustrating a writing voltage of the magnetoresistance effect element of Example 2.

As illustrated in FIG. 19, it can be seen that the resistance value of the spin-orbit torque wiring has decreased due to the insertion layer provided in the spin-orbit torque wiring. In addition, as illustrated in FIG. 20, the writing current has decreased until the insertion layer has a constant thickness, and the writing current has increased after exceeding the constant thickness. When the insertion layer was formed of Cu, the constant thickness was 0.6 nm, and when it was formed of Ag, the constant thickness was 1.0 nm.

It is considered, as a reason therefor, that the amount of current flowing in the spin-orbit torque wiring has increased due to a large quantity of currents flowing in the insertion layer that is unlikely to generate spins injected into the first ferromagnetic layer 1 but the amount of spins injected into the first ferromagnetic layer 1 is not sufficiently ensured. In addition, a current was likely to flow in the spin-orbit torque wiring and the writing voltage decreased by providing the insertion layer as illustrated in FIG. 21.

EXPLANATION OF REFERENCES

1 First ferromagnetic layer
2 Second ferromagnetic layer
3 Nonmagnetic layer
10 Resistance variation part
20, 21, 22, 23 Spin-orbit torque wiring
20A, 23A Spin generation layer
23A1 First spin generation layer
20B, 22B, 23B Insertion layer
31, 32 Ferromagnetic layer
33 Nonmagnetic layer
34 Conductive layer
35 Hard mask layer
90 Insulating layer
100, 101, 102, 103, 103A, 104, 105, 106 Magnetoresistance effect element
107 Magnetization rotational element
110 First switching element
120 Second switching element
130 Third switching element
200 Magnetic recording array
Cm1 to Cmn Common wiring
Cw Conductive part
D Drain
G Gate electrode
GI Gate insulating film
M1, M2 Magnetization
Rp1 to Rpn Reading wiring
S Source
Sub Substrate
Tr Transistor
Wp1 to Wpn Writing wiring

What is claimed is:

1. A magnetization rotational element comprising:
a spin-orbit torque wiring; and
a first ferromagnetic layer which is located in a first direction with respect to the spin-orbit torque wiring and configured for spins to be injected from the spin-orbit torque wiring,
wherein the spin-orbit torque wiring has a plurality of spin generation layers and at least one insertion layer located between the plurality of spin generation layers in the first direction,
the insertion layer has a lower electrical resistivity than the spin generation layers, and
the spin generation layers include an element selected from the group consisting of Mo, Ru, Rh, Pd, Ta, W, Ir, Pt, Au, and Bi.

2. The magnetization rotational element according to claim 1,
wherein the insertion layer includes an element selected from a group consisting of Mg, Al, Si, Ti, Cr, Fe, Co, Cu, Ga, Ge, and Ag.

3. The magnetization rotational element according to claim 1,
wherein a thickness of the insertion layer is equal to or smaller than a spin diffusion length in a material constituting the insertion layer.

4. The magnetization rotational element according to claim 1,
wherein the at least one insertion layer comprises a plurality of insertion layers, and
wherein the number of the insertion layers is six or smaller.

5. The magnetization rotational element according to claim 1,
wherein the spin-orbit torque wiring comprises an overlapping region that overlaps the first ferromagnetic region and non-overlapping region that is free of overlapping with the first ferromagnetic region in a plan view in the first direction, and
wherein the at least one insertion layer extends over the non-overlapping region with the overlapping region interposed therebetween.

6. The magnetization rotational element according to claim 1,
wherein the thickness of the at least one insertion layer is smaller than a thickness of each of the spin generation layers.

7. The magnetization rotational element according to claim 1,
wherein the thickness of the at least one insertion layer is equal to or smaller than five times a coupling radius of an element constituting the insertion layers.

8. The magnetization rotational element according to claim 1,
wherein the thickness of the at least one insertion layer is 10 Å or smaller.

9. The magnetization rotational element according to claim 1,
wherein the thickness of each of the spin generation layers is within a range of 8 Å to 20 Å.

10. The magnetization rotational element according to claim 1,
wherein the at least one insertion layer includes an element constituting the spin generation layers.

11. A magnetization rotational element comprising:
a spin-orbit torque wiring; and
a first ferromagnetic layer which is located in a first direction with respect to the spin-orbit torque wiring and configured for spins to be injected from the spin-orbit torque wiring,
wherein the spin-orbit torque wiring has a plurality of spin generation layers and at least one insertion layer located between the plurality of spin generation layers in the first direction,
the insertion layer has a lower electrical resistivity than the spin generation layers,
the at least one insertion layer comprises a plurality of insertion layers, and
the number of the insertion layers is six or smaller.

12. The magnetization rotational element according to claim 11,
wherein the insertion layer includes an element selected from a group consisting of Mg, Al, Si, Ti, Cr, Fe, Co, Cu, Ga, Ge, and Ag.

13. The magnetization rotational element according to claim 11,
wherein the spin generation layers include an element selected from the group consisting of Mo, Ru, Rh, Pd, Ta, W, Ir, Pt, Au, and Bi.

14. The magnetization rotational element according to claim 11,
wherein a thickness of the insertion layer is equal to or smaller than a spin diffusion length in a material constituting the insertion layer.

15. The magnetization rotational element according to claim 11, wherein the spin-orbit torque wiring comprises an overlapping region that overlaps the first ferromagnetic region and non-overlapping region that is free of overlapping with the first ferromagnetic region in a plan view in the first direction, and wherein the at least one insertion layer extends over the non-overlapping region with the overlapping region interposed therebetween.

16. The magnetization rotational element according to claim 11, wherein the thickness of the at least one insertion layer is smaller than a thickness of each of the spin generation layers.

17. The magnetization rotational element according to claim 11, wherein the thickness of the at least one insertion layer is equal to or smaller than five times a coupling radius of an element constituting the insertion layers.

18. The magnetization rotational element according to claim 11, wherein the thickness of the at least one insertion layer is 10 Å or smaller.

19. The magnetization rotational element according to claim 11, wherein the thickness of each of the spin generation layers is within a range of 8 Å to 20 Å.

20. The magnetization rotational element according to claim 11, wherein the at least one insertion layer includes an element constituting the spin generation layers.

* * * * *